United States Patent
Kabiri et al.

(10) Patent No.: US 12,366,706 B2
(45) Date of Patent: *Jul. 22, 2025

(54) OPTICAL MICRODISKS FOR INTEGRATED DEVICES

(71) Applicant: Quantum-Si Incorporated, Branford, CT (US)

(72) Inventors: Ali Kabiri, Guilford, CT (US); Bing Shen, Branford, CT (US); Gerard Schmid, Guilford, CT (US); James Beach, Austin, TX (US); Kyle Preston, Guilford, CT (US); Sharath Hosali, Austin, TX (US)

(73) Assignee: Quantum-Si Incorporated, Branford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/627,563

(22) Filed: Apr. 5, 2024

(65) Prior Publication Data

US 2024/0272354 A1 Aug. 15, 2024

Related U.S. Application Data

(63) Continuation of application No. 17/893,101, filed on Aug. 22, 2022, now Pat. No. 11,977,257, which is a
(Continued)

(51) Int. Cl.
| | |
|---|---|
| *G02B 6/122* | (2006.01) |
| *G02B 6/12* | (2006.01) |
| *G02B 6/136* | (2006.01) |

(52) U.S. Cl.
CPC ............. *G02B 6/122* (2013.01); *G02B 6/136* (2013.01); *G02B 2006/12109* (2013.01); *G02B 2006/12138* (2013.01)

(58) Field of Classification Search
CPC .................. G02B 6/122; G02B 6/136; G02B 2006/12109; G02B 2006/12138;
(Continued)

(56) References Cited

U.S. PATENT DOCUMENTS

| | | |
|---|---|---|
| 5,961,924 A | 10/1999 | Reichert et al. |
| 6,787,308 B2 | 9/2004 | Balasubramanian et al. |

(Continued)

FOREIGN PATENT DOCUMENTS

| | | |
|---|---|---|
| CN | 101002322 A | 7/2007 |
| CN | 101952710 A | 1/2011 |

(Continued)

OTHER PUBLICATIONS

International Search Report and Written Opinion mailed Nov. 2, 2020 for International Application No. PCT/US2020/045101.
(Continued)

*Primary Examiner* — John Bedtelyon
(74) *Attorney, Agent, or Firm* — Wolf, Greenfield & Sacks, P.C.

(57) ABSTRACT

Apparatus and methods for improving optical signal collection in an integrated device are described. A microdisk can be formed in an integrated device and increase collection and/or concentration of radiation incident on the microdisk and re-radiated by the microdisk. An example integrated device that can include a microdisk may be used for analyte detection and/or analysis. Such an integrated device may include a plurality of pixels, each having a reaction chamber for receiving a sample to be analyzed, an optical microdisk, and an optical sensor configured to detect optical emission from the reaction chamber. The microdisk can comprise a dielectric material having a first index of refraction that is embedded in one or more surrounding materials having one or more different refractive index values.

20 Claims, 12 Drawing Sheets

Related U.S. Application Data continuation of application No. 16/987,937, filed on Aug. 7, 2020, now Pat. No. 11,454,758.

(60) Provisional application No. 62/884,395, filed on Aug. 8, 2019.

(58) Field of Classification Search
CPC ........ H01L 27/14621; H01L 27/14625; G01N 21/6408; G01N 2021/6471; G01N 2021/7786; G01N 21/6454; G01N 21/648; G01N 21/7746
See application file for complete search history.

(56) References Cited

U.S. PATENT DOCUMENTS

| | | |
|---|---|---|
| 6,917,726 B2 | 7/2005 | Levene et al. |
| 7,175,811 B2 | 2/2007 | Bach et al. |
| 7,426,322 B2 | 9/2008 | Hyde |
| 7,738,086 B2 | 6/2010 | Shepard et al. |
| 7,820,983 B2 | 10/2010 | Lundquist et al. |
| 7,834,329 B2 | 11/2010 | Lundquist et al. |
| 7,838,847 B2 | 11/2010 | Lundquist et al. |
| 8,053,742 B2 | 11/2011 | Lundquist et al. |
| 8,207,509 B2 | 6/2012 | Lundquist et al. |
| 8,274,040 B2 | 9/2012 | Zhong et al. |
| 8,278,728 B2 | 10/2012 | Murshid |
| 8,465,699 B2 | 6/2013 | Fehr et al. |
| 8,471,219 B2 | 6/2013 | Lundquist et al. |
| 8,471,230 B2 | 6/2013 | Zhong et al. |
| 8,502,169 B2 | 8/2013 | Rigneault et al. |
| 8,618,507 B1 | 12/2013 | Lundquist et al. |
| 9,029,802 B2 | 5/2015 | Lundquist et al. |
| 9,146,235 B2 | 9/2015 | Van Dorpe et al. |
| 9,157,864 B2 | 10/2015 | Fehr et al. |
| 9,222,123 B2 | 12/2015 | Zhong et al. |
| 9,222,133 B2 | 12/2015 | Lundquist et al. |
| 9,223,084 B2 | 12/2015 | Grot et al. |
| 9,372,308 B1 | 6/2016 | Saxena et al. |
| 9,587,276 B2 | 3/2017 | Lundquist et al. |
| 9,606,060 B2 | 3/2017 | Chen et al. |
| 9,658,161 B2 | 5/2017 | Saxena et al. |
| 9,666,748 B2 | 5/2017 | Leobandung |
| 9,719,138 B2 | 8/2017 | Zhong et al. |
| 9,765,395 B2 | 9/2017 | Goldsmith |
| 9,921,157 B2 | 3/2018 | Rothberg et al. |
| 9,946,017 B2 | 4/2018 | Saxena et al. |
| 9,983,135 B2 | 5/2018 | Rothberg et al. |
| 10,018,764 B2 | 7/2018 | Grot et al. |
| 10,090,429 B2 | 10/2018 | Leobandung |
| 10,138,515 B2 | 11/2018 | Fehr et al. |
| 10,280,457 B2 | 5/2019 | Zhong et al. |
| 10,310,178 B2 | 6/2019 | Saxena et al. |
| 10,487,356 B2 | 11/2019 | Lundquist et al. |
| 10,578,788 B2 | 3/2020 | Grot et al. |
| 10,655,172 B2 | 5/2020 | Rank et al. |
| 10,724,090 B2 | 7/2020 | McCaffrey et al. |
| 11,454,758 B2 | 9/2022 | Kabiri et al. |
| 11,692,938 B2 | 7/2023 | Kabiri et al. |
| 11,977,257 B2 * | 5/2024 | Kabiri ................... G01N 21/648 |
| 2002/0182716 A1 | 12/2002 | Weisbuch et al. |
| 2003/0174992 A1 | 9/2003 | Levene et al. |
| 2010/0065726 A1 | 3/2010 | Zhong et al. |
| 2012/0021525 A1 | 1/2012 | Fehr et al. |
| 2012/0257204 A1 | 10/2012 | Walters |
| 2013/0116153 A1 | 5/2013 | Bowen et al. |
| 2013/0143206 A1 | 6/2013 | McCaffrey et al. |
| 2013/0148126 A1 | 6/2013 | Walters et al. |
| 2015/0037815 A1 | 2/2015 | Miller et al. |
| 2015/0141267 A1 | 5/2015 | Rothberg et al. |
| 2015/0141268 A1 | 5/2015 | Rothberg et al. |
| 2015/0168392 A1 | 6/2015 | Van Dorpe et al. |
| 2015/0177150 A1 | 6/2015 | Rothberg et al. |
| 2016/0041095 A1 | 2/2016 | Rothberg et al. |
| 2016/0084761 A1 | 3/2016 | Rothberg et al. |
| 2016/0355869 A1 | 12/2016 | Blair et al. |
| 2016/0363728 A1 | 12/2016 | Wang et al. |
| 2017/0107562 A1 | 4/2017 | Rothberg et al. |
| 2017/0146479 A1 | 5/2017 | Levine et al. |
| 2017/0188901 A1 | 7/2017 | Faraon et al. |
| 2017/0191125 A1 | 7/2017 | Vijayan et al. |
| 2017/0227465 A1 | 8/2017 | Hsieh et al. |
| 2018/0059020 A1 | 3/2018 | Strangi et al. |
| 2018/0088052 A1 | 3/2018 | Rothberg et al. |
| 2018/0120229 A1 | 5/2018 | Rothberg et al. |
| 2018/0239087 A1 | 8/2018 | Saxena et al. |
| 2018/0328850 A1 | 11/2018 | Rothberg et al. |
| 2019/0292590 A1 | 9/2019 | Zhong et al. |
| 2019/0318300 A1 | 10/2019 | Cox |
| 2020/0400568 A1 | 12/2020 | Kabiri et al. |
| 2021/0041625 A1 | 2/2021 | Kabiri et al. |
| 2022/0397720 A1 | 12/2022 | Kabiri et al. |
| 2023/0114694 A1 | 4/2023 | Schmid et al. |
| 2024/0142378 A1 | 5/2024 | Kabiri et al. |

FOREIGN PATENT DOCUMENTS

| | | |
|---|---|---|
| EP | 2 884 261 A1 | 6/2015 |
| EP | 3 045 896 A1 | 7/2016 |
| WO | WO 2011/153962 A1 | 12/2011 |
| WO | WO 2014/130900 A1 | 8/2014 |
| WO | WO 2015/074004 A1 | 5/2015 |
| WO | WO 2018/190577 A1 | 10/2018 |

OTHER PUBLICATIONS

International Preliminary Report on Patentability mailed Feb. 17, 2022 for International Application No. PCT/US2020/045101.

International Search Report and Written Opinion for International Application No. PCT/US2020/038415 dated Oct. 8, 2020.

International Preliminary Report on Patentability for International Application No. PCT/US2020/038415 dated Dec. 30, 2021.

International Search Report and Written Opinion for International Application No. PCT/US2022/046121 dated Feb. 23, 2023.

International Preliminary Report on Patentability for International Application No. PCT/US2022/046121 mailed Apr. 25, 2024.

Hale, Fibre Optic Sensors using Adiabatically Tapered Single Mode Fibres. Dissertation submitted to the University of Cambridge. Feb. 1994. 209 pages.

Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.

Taitt et al., Evanescent wave fluorescence biosensors. Biosens Bioelectron. Jun. 2005;20(12):2470-87. Epub Dec. 8, 2004.

U.S. Appl. No. 17/962,376, filed Oct. 7, 2022, Schmid et al.

U.S. Appl. No. 18/320,964, filed May 19, 2023, Kabiri et al.

PCT/US2020/045101, Nov. 2, 2020, International Search Report and Written Opinion.

PCT/US2020/045101, Feb. 17, 2022, International Preliminary Report on Patentability.

PCT/US2020/038415, Oct. 8, 2020, International Search Report and Written Opinion.

PCT/US2020/038415, Dec. 30, 2021, International Preliminary Report on Patentability.

PCT/US2022/046121, Feb. 23, 2023, International Search Report and Written Opinion.

PCT/US2022/046121, Apr. 25, 2024, International Preliminary Report on Patentability.

* cited by examiner

OPTICAL MICRODISKS FOR INTEGRATED DEVICES

CROSS-REFERENCE TO RELATED APPLICATIONS

This application is a continuation claiming the benefit under 35 U.S.C. § 120 of U.S. application Ser. No. 17/893,101, filed Aug. 22, 2022, titled "Optical Microdisks for Integrated Devices," which is a continuation claiming the benefit under 35 U.S.C. § 120 of U.S. patent application Ser. No. 16/987,937, filed Aug. 7, 2020 and titled "Optical Microdisks for Integrated Devices," which claims priority under 35 U.S.C. § 119(e) to U.S. Provisional Application No. 62/884,395, filed Aug. 8, 2019 and titled "Optical Microdisks for Integrated Devices," each application of which is herein incorporated by reference in its entirety.

FIELD OF THE APPLICATION

The present application relates to optical microdisks that can increase collection efficiency and/or concentration of radiation within an integrated device.

BACKGROUND

Some microfabricated chips may be used to analyze a large number of analytes or specimens in parallel. In some cases, optical excitation radiation is delivered to a plurality of discrete sites on a chip at which separate analyses are performed. The excitation radiation may excite a specimen at each site, a fluorophore attached to the specimen, or a fluorophore involved in an interaction with the specimen. In response to the excitation, radiation may be emitted from a site and the radiation can be detected by a sensor. Information obtained from the emitted radiation for a site, or lack of emitted radiation, can be used to determine a characteristic of the specimen at that site.

SUMMARY

Apparatus and methods relating to optical microdisks are described. Such optical microdisks may improve collection and/or concentration of radiation incident on the microdisk and passing through the microdisk to a detector. Optical microdisks may be formed in integrated devices that include optical sensors, such as photodiodes, CCD photodiode arrays, CMOS photodiode arrays, image sensor arrays, fluorescent sensor arrays, bio-sensor chips, and integrated devices (or lab on chips) adapted for genetic sequencing and/or protein sequencing, for example. In such applications, radiation to be detected may be very low in intensity, leading to a small signal-to-noise ratio (SNR) and decreased sensing accuracy. Including an optical microdisk in such a device may help focus or concentrate the radiation onto a sensor, thereby increasing the SNR, which can result in increased sensing accuracy and/or faster sensing.

In an example embodiment, an optical microdisk can be used in connection with instruments for analyzing specimens, where optical detection is used to analyze the radiation emitted by a specimen or fluorophore attached to or associated with a specimen in response to optical excitation delivered to the specimen. Specimens may include biological materials such as genetic material or proteins that are to be analyzed by the instrument. More generally, embodiments of optical microdisks described herein may be used in applications in which it is desired to increase SNR by increasing the collection and/or concentration of emission radiation or other radiation (such as for imaging, display, or optical communication purposes). Among other possible contexts, optical microdisks described herein may be used in conjunction with, for example, integrated detectors in optical communication systems, LED emitter arrays, and/or imaging arrays.

Some embodiments relate to a microfabricated structure on a substrate having one or more pixels. Each pixel may comprise a reaction chamber, a waveguide configured to deliver excitation radiation to the reaction chamber, an optical sensor configured to detect emission radiation emitted from the reaction chamber, and a microdisk disposed between the waveguide and the optical sensor and configured to increase an amount of the emission radiation that is received by the optical sensor compared to an amount of the emission radiation that would be received by the optical sensor without the microdisk.

Some embodiments relate to a method of operating an integrated device. The method includes acts of: delivering excitation energy from an optical waveguide to a reaction chamber, wherein the optical waveguide and reaction chamber are integrated on a substrate of the integrated device; passing emission radiation from the reaction chamber through a microdisk to a sensor that is integrated on the substrate; and increasing with the microdisk an amount of the emission radiation received by the sensor compared to an amount of the emission radiation that would be received without the microdisk.

Some embodiments relate to a method of fabricating an integrated device. The method includes acts of: forming, at each of a plurality of pixels on a substrate, a reaction chamber, an optical waveguide arranged to deliver excitation radiation to the reaction chamber, and an optical sensor arranged to receive emission radiation from the reaction chamber; and forming a microdisk at each pixel between the waveguide and the optical sensor, wherein the microdisk is configured to increase an amount of the emission radiation that is received by the optical sensor compared to an amount of the emission radiation that would be received without the microdisk.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 1-2 depicts further details of a pixel comprising a reaction chamber, optical waveguide, and sensor, according to some embodiments.

FIG. 1-3 depicts an example of a biological reaction that can occur within a reaction chamber, according to some embodiments.

FIG. 1-4 depicts an example of polypeptide sequencing that can occur within a reaction chamber, according to some embodiments.

FIG. 1-5 depicts an example of polypeptide sequencing that can occur within a reaction chamber, according to some embodiments FIG. 1-6 schematically depicts an example microfabricated structure that includes a microdisk at a pixel of an integrated device, according to some embodiments;

FIG. 1-7 schematically depicts an example microfabricated structure that includes a microdisk surrounded by rings at a pixel of an integrated device, according to some embodiments;

FIG. 2-1 schematically depicts an example microfabricated structure at a pixel of an integrated device, according to some embodiments;

FIG. 2-2 depicts a computer-simulated optical emission pattern from a reaction chamber at a pixel of an integrated device, according to some embodiments;

FIG. 2-3 depicts a computer-simulated optical emission pattern from a reaction chamber at a pixel of an integrated device, according to some embodiments;

FIG. 3-1 is a plot illustrating normalized emission collection efficiency as a function of the location of a microdisk in an integrated device, according to some embodiments;

FIG. 3-2 is a plot illustrating emission collection efficiency with and without a microdisk as a function of iris diameter, according to some embodiments;

FIG. 3-3 is a contour plot illustrating normalized collection efficiency as a function of microdisk diameter and iris diameters, according to some embodiments;

FIG. 3-4 is a contour plot illustrating an increase in an amount of emission radiation received by a sensor due to the microdisk as a function of upper and lower iris diameters, according to some embodiments;

FIG. 4-1 is a scanning electron microscope image of an example microfabricated structure at a pixel of an integrated device, according to some embodiments;

FIG. 4-2 is a scanning electron microscope image of an example microfabricated structure at a pixel of an integrated device, according to some embodiments; and FIG. 5-1A, FIG. 5-1B, FIG. 5-1C, FIG. 5-1D, FIG. 5-1E, and 5-1F depict structures associated with an example method for fabricating a microdisk, according to some embodiments.

Figure 1:
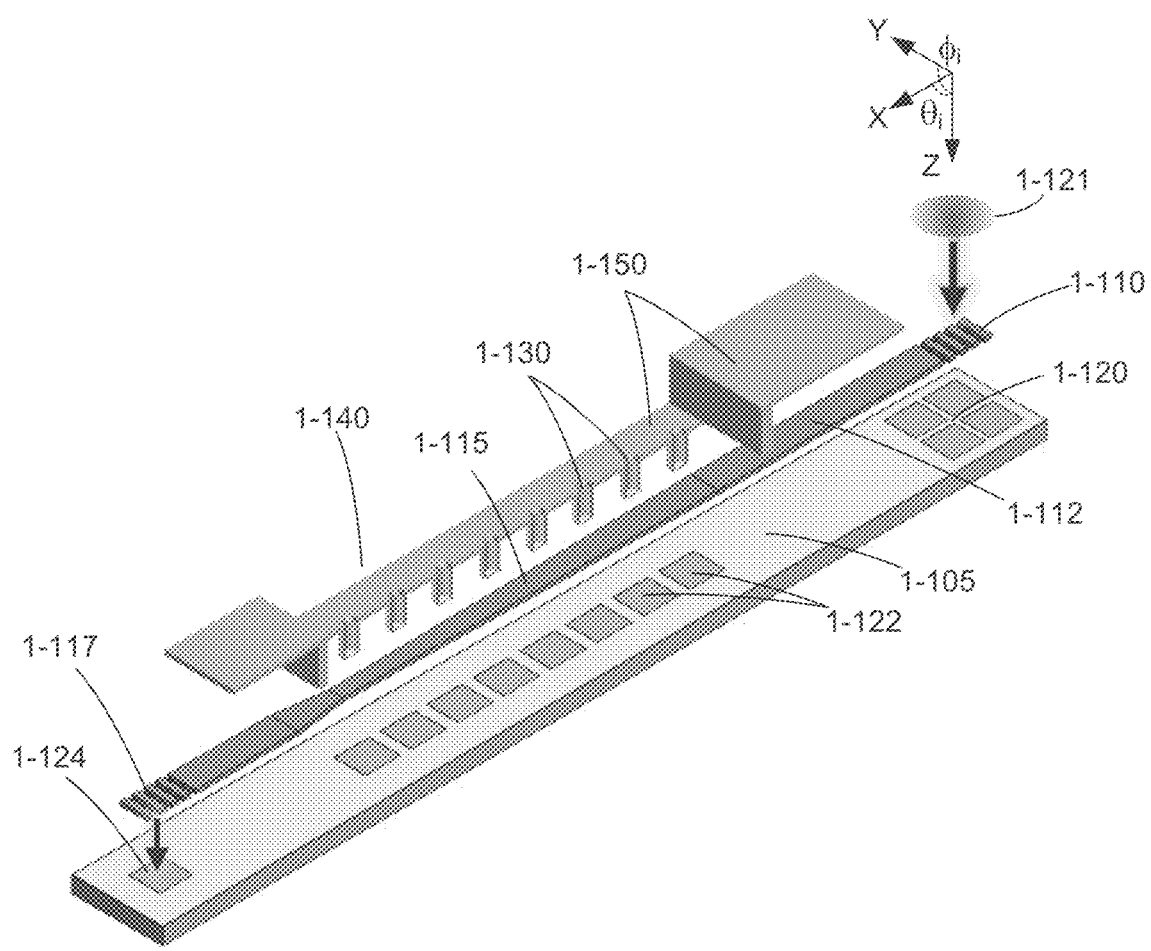
FIG. 1-1 depicts an example of a portion of an integrated device having an array of reaction chambers that can be excited optical pulses via one or more waveguides and corresponding detectors for each reaction chamber, according to some embodiments.

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Integrated Device with an Optical Microdisk

The inventors have recognized and appreciated that a compact, high-speed apparatus for performing detection of single molecules, proteins, or particles could reduce the cost of performing complex quantitative measurements of biological and/or chemical samples and rapidly advance the rate of biochemical technology discoveries. Moreover, a cost-effective device that is readily transportable could provide people in developing regions access to essential diagnostic tests that could dramatically improve their health and well-being. For example, embodiments described herein may be used for diagnostic tests of blood, urine and/or saliva that may be used by individuals in their home, or by a doctor at a mobile clinic or a remote clinic in a developing country. In some cases, it is desirable to have portable, hand-held instruments for analyzing samples, so that technicians or medical personnel can easily carry the instrument into the field where service is needed and analyze a sample quickly and accurately. According to some embodiments, a portable instrument may be used for gene sequencing, protein sequencing, or performing conventional sample analyses, such as complete blood count analysis. In more advanced clinical settings, a desk-top size instrument may be desired for more complex sample analyses.

Instruments for analyzing such samples may utilize microfabricated structures and devices (e.g., electronic amplifiers, logic devices, optoelectronic devices, and/or microfluidic devices, etc.) that are formed on one or more chips. Such chips can help reduce the overall size of the instrument. Dies for such chips may have one or a plurality (e.g., hundreds, thousands, millions, or more) of pixels, each comprising one or more microfabricated devices configured to participate in analyte detection and/or signal analysis. In some implementations, a packaged die (also referred to as an "integrated device" or "chip" herein) may be a single-use, disposable element that a user inserts into an instrument for a measurement and disposes after completion of the measurement. In some cases, the instrument and integrated device may be configured for biomolecular detection and/or analysis. The molecules may be, by way of example and not limitation, proteins and/or DNA. Such an integrated device may be used to perform massively parallel analyses of specimens (e.g., perform "biological assays" or "bioassays"), thereby increasing the speed at which such biological analyses may be completed. In some embodiments, the disposable integrated device may be mounted into a receptacle of an advanced analytic instrument by a user, and interface with optical and electronic components in the instrument. The disposable integrated device can be replaced easily by a user for each new sample analysis.

In some embodiments, an integrated device can comprise a bio-optoelectronic chip on which a large number of pixels having reaction chambers are formed and arranged for parallel optical analyses of analytes. An example portion of a bio-optoelectronic chip is depicted in FIG. 1-1, which shows reaction chambers 1-130 and corresponding sensors 1-122 for each of a plurality of pixels (eight, in this example). When an analyte is present in a reaction chamber 1-130 and tagged with one or a plurality of luminescent markers (also referred to herein as "fluorophores"), the marker(s) may be excited by excitation radiation 1-121 delivered via an optical waveguide 1-112 to the reaction chamber 1-130. Emission radiation from the marker(s) can be detected by a corresponding sensor 1-122 and used to identify the type of marker(s) that is(are) present in pixel, which in turn can provide information about the analyte in the pixel. The inventors have recognized and appreciated that an analysis based on detection of emission radiation from the marker(s) may be significantly affected by the signal-to-noise ratio (SNR), since the amount of emission radiation (signal) from one or more markers in a pixel can be very low. Sources of optical noise can include any source of optical radiation that is not from the optical emission of the luminescent marker(s) in a reaction chamber 1-130 of a corresponding sensor 1-122 (e.g., stray emission radiation from an adjacent reaction chamber, scattered excitation radiation from regions of the waveguide 1-112, 1-115, scattered light from outside the chip, etc.). By increasing the amount of emission radiation from a reaction chamber 1-130 that reaches a respective optical sensor 1-122 within the pixel, the SNR may be increased resulting in faster and/or more accurate measurements.

One way to increase the amount of emission radiation from a reaction chamber 1-130 that is received by a corresponding optical sensor 1-122 is to locate an optical microdisk 1-605 between the reaction chamber 1-130 and sensor 1-122, as in an example embodiment depicted in FIG. 1-4. An optical microdisk formed from a dielectric material can collect emission radiation from the reaction chamber 1-130 and redirect the emission radiation to the optical sensor 1-122 that might otherwise be lost. Embodiments of an optical microdisk collector (hereinafter, "optical microdisk" or "microdisk") for increasing the SNR in integrated optical sensing applications are described below. It should be appreciated that various aspects relating to an optical microdisk that are described herein may be implemented in any of numerous ways. Examples of specific implementations are provided herein for illustrative purposes only. In addition, the various aspects described in the embodiments below may be used alone or in any combination, and are not limited to the combinations explicitly described herein.

Returning to FIG. 1-1, in some embodiments, the excitation radiation 1-121 may be coupled to one or more waveguides 1-112 via a grating coupler 1-110, though coupling to an end of an optical waveguide may be used in some cases. Excitation radiation 121 may be generated by a radiation source such as is described in U.S. Patent Publication No. 2015/0141267, filed on Nov. 17, 2014 and titled "Integrated Device with External Light Source for Probing Detecting and Analyzing Molecules," which is incorporated herein by reference in its entirety. According to some embodiments, a quad detector 1-120 may be located on a semiconductor substrate 1-105 (e.g., a silicon substrate, though other semiconductor materials may be used) near the grating coupler 1-110 for aiding in alignment of the beam of excitation radiation 1-121 to the grating coupler 1-110. In some implementations, one or more sensors 1-122 may be used to sense excitation radiation and aid in alignment of the excitation radiation 1-121 to the grating coupler 1-110. The sensors 1-122 may comprise photodetectors (e.g., time-binning photodetectors or single-photon avalanche photodiodes). The one or more waveguides 1-112 and reaction chambers 1-130 may be integrated on the same semiconductor substrate 1-105 with intervening dielectric layers (e.g., silicon dioxide layers, not shown) between the substrate, waveguide, reaction chambers, and sensors 1-122. The sensor 1-122 may connect to other complementary metal-oxide-semiconductor (CMOS) circuitry on the substrate via interconnects (not shown). A distance from the bottom of the optical waveguide 1-115 to the sensor 1-122 can be between 500 nm and 10 µm.

Each waveguide 1-112 may include a tapered portion 1-115 below the reaction chambers 1-130 to equalize optical power coupled to the reaction chambers along the waveguide. The reducing taper may force more excitation radiation energy outside the waveguide's core, increasing coupling to the reaction chambers and compensating for optical losses along the waveguide, including losses for excitation radiation coupling into the reaction chambers. A second grating coupler 1-117 may be located at an end of each waveguide to direct optical energy to an integrated photodiode 1-124. The integrated photodiode may detect an amount of power coupled down a waveguide and provide an electrical signal to feedback circuitry that controls, for example, a beam-steering module that controls the position and angle of excitation radiation 1-121 incident on the grating coupler 1-110, for example.

The reaction chambers 1-130 may be aligned with the tapered portion 1-115 of the waveguide and recessed in a tub 1-140. A metal coating and/or multilayer coating 1-150 may be formed around the reaction chambers and above the waveguide to prevent excitation of fluorophores that are not in the reaction chambers 1-130 (e.g., dispersed in a solution above the reaction chambers). The metal coating and/or multilayer coating 1-150 may be raised beyond edges of the tub 1-140 to reduce absorptive losses of the excitation energy in the waveguide 1-112 at the input and output ends of each waveguide. In some implementations, a multilayer, discriminating optical structure may be formed above each sensor 1-122 and configured to preferentially attenuate excitation radiation over emission from the fluorophores.

In some embodiments, a reaction chamber 1-130 may be formed in a transparent or semitransparent material, such as an oxide or a nitride, so that excitation radiation from the optical waveguide 1-115 and emission radiation from the reaction chamber 1-130 may pass through the transparent or semitransparent material without being attenuated by more than 10%, for example. The reaction chambers 1-130 may have a depth between 50 nm and 1 µm, according to some embodiments. A minimum diameter of a reaction chamber 1-130 may be between 50 nm and 300 nm in some embodiments. If a reaction chamber 1-130 is formed as a zero-mode waveguide, then the minimum diameter may be even less than 50 nm in some implementations. If large analytes are to be analyzed, the minimum diameter may be larger than 300 nm. The reaction chamber may be located above the optical waveguide 1-115 such that a bottom of the reaction chamber may be up to 500 nm above a top of the waveguide 1-115.

There may be a plurality of rows of waveguides 1-112, reaction chambers 1-130, and photodetectors 1-122 on the integrated device in addition to the single row shown in FIG. 1-1. For example, there may be 64 rows, each having 512 reaction chambers, for a total of 32,768 reaction chambers in some implementations. Other implementations may include fewer or more reaction chambers, and may include other layout configurations. In some cases, there can be more than 64 rows and more than 512 reaction chambers in a row, such that the total number of pixels and reaction chambers on a chip can be between 64,000 and 10,000,000. Excitation radiation power may be distributed to the multiple waveguides 1-112 via one or more star couplers or multi-mode interference couplers (not shown), or by any other means, located between an optical coupler 1-110 and the plurality of waveguides 1-112. In some cases, an optical coupler 1-110 may span a plurality of single-mode waveguides 1-112, such that an input beam is coupled simultaneously into the plurality of single-mode waveguides 1-112, as described in U.S. Provisional Patent Application No. 62/861,832, filed Jun. 14, 2019, titled "Sliced Grating Coupler with Increased Beam Alignment Sensitivity," which application is incorporated by reference herein in its entirety. Waveguides 1-112 and reaction chambers 1-130 can be formed by microfabrication processes described in U.S. patent application Ser. No. 14/821,688, filed Aug. 7, 2015, titled "Integrated Device for Probing, Detecting and Analyzing Molecules," which is incorporated by reference herein in its entirety.

Figures 1, 2:
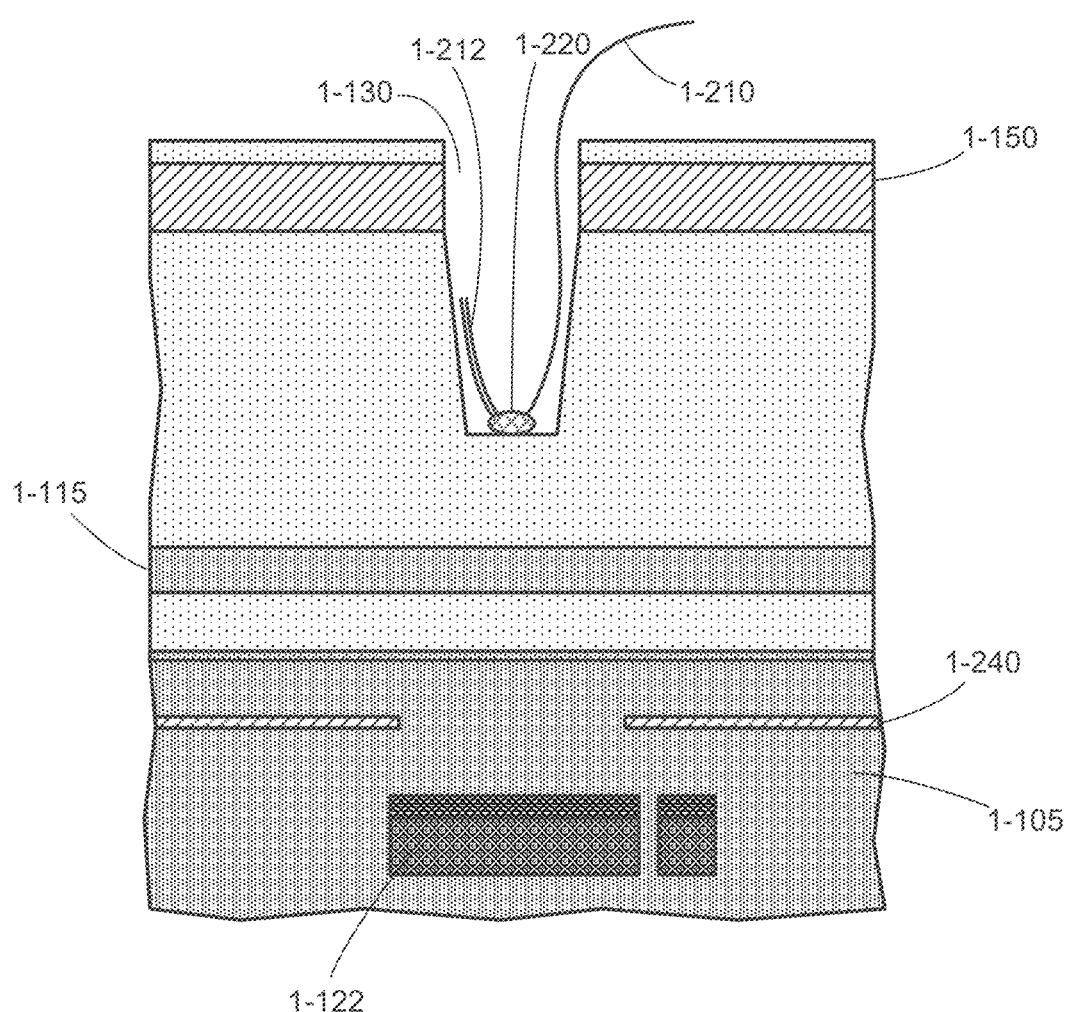

A non-limiting example of a biological reaction taking place in a reaction chamber 1-130 is depicted in FIG. 1-2, though other reactions or analytes may be used in other applications. In this example, sequential incorporation of nucleotides or nucleotide analogs into a growing strand 1-212 that is complementary to a target nucleic acid 1-210 is taking place in the reaction chamber 1-130. The sequential incorporation can be detected to sequence DNA. The reaction chamber may have a depth between about 150 nm and about 250 nm and a diameter between about 80 nm and about 160 nm. A metallization layer 1-240 (which could optionally comprise a metallization for an electrical reference potential) may be patterned above the photodetector and provide an aperture that blocks stray light from adjacent reaction chambers and other unwanted, off-axis light sources. According to some embodiments, polymerase 1-220 may be located within the reaction chamber 1-130 (e.g., attached to a base of the chamber). The polymerase may take up a target nucleic acid 1-210 (e.g., a portion of nucleic acid derived from DNA), and sequence a growing strand of complementary nucleic acid to produce a growing strand of DNA 1-212. Nucleotides or nucleotide analogs 1-310 (depicted in FIG. 1-3) labeled with different fluorophores may be dispersed in a solution above the reaction chamber 1-130 and enter the reaction chamber.

Figures 1, 2, 3:
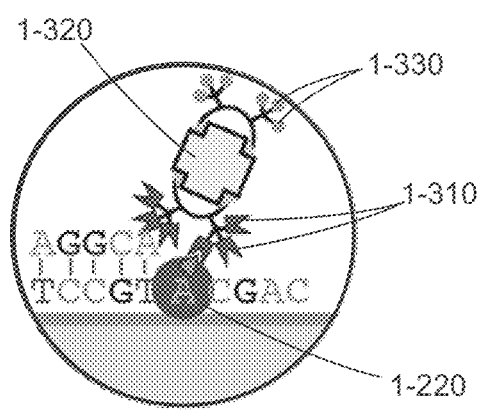

When a labeled nucleotide or nucleotide analog 1-310 is incorporated into a growing strand of complementary nucleic acid, as depicted in FIG. 1-3, one or more attached fluorophores 1-330 may be repeatedly excited by pulses of optical energy (excitation radiation) coupled into the reaction chamber 1-130 from the waveguide 1-115. In some embodiments, the fluorophore or fluorophores 1-330 may be attached to one or more nucleotides or nucleotide analogs 1-310 with any suitable linker 1-320. An incorporation event may last for a period of time up to about 100 ms. During this time, pulses of fluorescent emission radiation resulting from excitation of the fluorophore(s) may be detected with sensor 1-122. By attaching fluorophores with different emission characteristics (e.g., fluorescent decay rates, intensity, fluorescent wavelength) to the different nucleotides (A,C,G,T), detecting and distinguishing the different emission characteristics while each nucleic acid is incorporated into the strand of DNA 1-212 enables determination of the sequence of the growing strand of DNA. By comparing results from multiple reaction chambers, any errors in nucleotide incorporation by the polymerase can be detected and a genetic sequence of the target DNA can be determined.

In some aspects, embodiments include methods of polypeptide and protein sequencing in real-time by evaluating binding interactions of terminal amino acids with labeled amino acid recognition molecules and a labeled cleaving reagent (e.g., a labeled exopeptidase). FIG. 1-4 shows an example of a method of sequencing in which discrete binding events give rise to signal pulses of a signal output 1-400. The inset panel of FIG. 1-4 illustrates a general scheme of real-time sequencing by this approach. As shown, a labeled amino acid recognition molecule 1-410 can selectively bind to and dissociate from a terminal amino acid (shown here as lysine). This binding and dissociation gives rise to a series of pulses in signal output 1-400 that may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 1-410 selectively binds and dissociates according to a binding affinity ($K_D$) defined by an association rate of binding ($k_{on}$) and a dissociation rate of binding ($k_{off}$). The rate constants $k_{off}$ and $k_{on}$ are determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture may further comprise a labeled cleaving reagent 1-420 comprising a detectable label that is different than that of labeled amino acid recognition molecule 1-410. In some embodiments, a labeled cleaving reagent 1-420 can be present in the mixture at a concentration that is less than that of labeled amino acid recognition molecule 1-410. In some embodiments, a labeled cleaving reagent 1-420 displays broad specificity such that it cleaves most or all types of terminal amino acids.

As illustrated by the progress of signal output 1-400, in some embodiments, terminal amino acid cleavage by labeled cleaving reagent 1-420 can give rise to a uniquely identifiable signal pulse (indicated as a "cleavage" event in FIG. 1-4), and these events may occur with lower frequency than the binding and dissociation pulses of a labeled amino acid recognition molecule 1-410. In this way, amino acids of a polypeptide or protein can be counted and/or identified in a real-time sequencing process. As further illustrated in signal output 1-400, in some embodiments, a labeled amino acid recognition molecule 1-410 can be engineered to bind more than one type of amino acid with different binding and dissociation properties corresponding to each type of amino acid, which produces uniquely identifiable pulsing patterns (e.g., as indicated by the "K," "F," and "Q" sets of pulses). In some embodiments, a plurality of labeled amino acid recognition molecules may be used, each with a diagnostic pulsing pattern which may be used to identify a corresponding terminal amino acid.

In some aspects, embodiments include a method of sequencing a peptide, polypeptide, or protein by detecting luminescence of a labeled peptide, polypeptide, or protein which is subjected to repeated cycles of terminal amino acid modification and cleavage. For example, FIG. 1-5 shows a method of sequencing a labeled polypeptide by Edman degradation. In some embodiments, the method generally proceeds as described for other methods of sequencing by Edman degradation. For example, in some embodiments, steps (1) and (2) shown in FIG. 1-5 may be performed for terminal amino acid modification and terminal amino acid cleavage, respectively, in an Edman degradation reaction.

As shown in the example depicted in FIG. 1-5, the method may comprise a step of (1) modifying the terminal amino acid of a labeled polypeptide. In some embodiments, modifying comprises contacting the terminal amino acid with an isothiocyanate (e.g., PITC) to form an isothiocyanate-modified terminal amino acid 1-510. In some embodiments, an isothiocyanate modification 1-510 converts the terminal amino acid to a form that is more susceptible to removal by a cleaving reagent (e.g., a chemical or enzymatic cleaving reagent). Accordingly, in some embodiments, the method comprises a step of (2) removing the modified terminal amino acid using chemical or enzymatic means for Edman degradation.

In some embodiments, the method comprises repeating steps (1) through (2) for a plurality of cycles, during which luminescence of the labeled polypeptide is detected. Cleavage events corresponding to the removal of a labeled amino acid from the terminus may be detected as a decrease in detected signal, as described in connection with FIG. 1-4, for example. In some embodiments, no change in signal following step (2) as shown in FIG. 1-5 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some embodiments are useful for determining amino acid sequence information from peptides, polypeptides, or proteins (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps, examples of which are described above in connection with FIG. 1-4 and FIG. 1-5.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the peptide, polypeptide, or protein are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Example methods of selective labeling of amino acid side chains and details relating to the preparation and analysis of labeled polypeptides are described in (see, e.g., Swaminathan, et al. *PLoS Comput Biol.* 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a peptide, polypeptide, or protein refers to determining sequence information for a peptide, polypeptide, or protein. In some embodiments, this can involve determining the identity of each sequential amino acid for a portion (or all) of the peptide, polypeptide, or protein. However, in some embodiments, this can involve assessing the identity of a subset of amino acids within the peptide, polypeptide, or protein (e.g., and determining the relative position of one or more amino acid types without determining the identity of each amino acid in the peptide, polypeptide, or protein). However, in some embodiments amino acid content information can be obtained from a peptide, polypeptide, or protein without directly determining the relative position of different types of amino acids in the peptide, polypeptide, or protein. The amino acid content alone may be used to infer the identity of the peptide, polypeptide, or protein that is present (e.g., by comparing the amino acid content to a database of peptide, polypeptide, or protein information and determining which peptide(s), polypeptide(s), or protein(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, in some embodiments, the application provides compositions and methods for sequencing a polypeptide or protein by sequencing a plurality of fragments of the polypeptide or protein. In some embodiments, sequencing a polypeptide or protein comprises combining sequence information for a plurality of polypeptide or protein fragments to identify and/or determine a sequence for the polypeptide or protein. In some embodiments, combining sequence information may be performed by computer hardware and software. The methods described herein may allow for a set of related polypeptides, such as an entire proteome of an organism, to be sequenced. In some embodiments, a plurality of single-molecule-sequencing reactions are performed in parallel (e.g., on a single bio-optoelectronic chip) according to aspects of the present application. For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. In some embodiments, the application provides methods of uniquely identifying an individual protein in a complex mixture of proteins. In some embodiments, an individual protein is detected in a mixed sample by determining at least a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. *PLoS Comput Biol.* 2015, 11(2):e1004080; and Yao, et al. *Phys. Biol.* 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with the application, in some aspects, can involve immobilizing a peptide, polypeptide, or protein on a surface of a substrate or solid support, such as a chip or integrated device. In some embodiments, a peptide, polypeptide, or protein can be immobilized on a surface of a sample well (e.g., on a bottom surface of a sample well) on a substrate. In some embodiments, a first terminus of a peptide, polypeptide, or protein is immobilized to a surface, and the other terminus is subjected to a sequencing reaction. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage. In some embodiments, a plurality of peptides, polypeptides, or proteins are attached to a plurality of sample wells or reaction chambers of a bio-optoelectronic chip or integrated device described in connection with FIG. 1-1 and FIG. 1-2 (e.g., with one peptide, polypeptide, or protein attached to a surface, for example a bottom surface, of each sample well).

Optical microdisks described herein that can improve collection of emission radiation are not limited to only applications in instruments configured for genetic or polypeptide sequencing or to use only in connection with integrated devices having the structure described in FIG. 1-1 and FIG. 1-2. More generally, embodiments of optical microdisks described herein may be used in applications in which it is desired to increase SNR or increase a desired light intensity by increasing the collection of emission radiation or other radiation for microscale devices. Among other possible contexts, optical microdisks described herein may be used in conjunction with, for example, integrated detectors in optical communication systems (improved signal collection), imaging arrays (improved signal collection), and/or LED emitters or emitting arrays (improved concentration of emission).

Referring to FIG. 1-6, in some implementations a microdisk 1-605 may be disposed within at least one surrounding medium 1-610 between the waveguide 1-112 and the sensor 1-122. According to some embodiments, the microdisk 1-605 may be made of one or more materials transparent at the wavelength of the emission radiation, and with a refractive index different (e.g., greater) than the refractive index of the surrounding medium 1-610. As a non-limiting example, the microdisk may be formed of silicon nitride, and the surrounding medium 1-610 may be formed of silicon dioxide. A dielectric material that may be used to form the microdisk 1-605 may be amorphous, mono-crystalline, or poly-crystalline, doped or undoped, and/or an alloy of two or more materials. Other example materials include, but are not limited to aluminum oxide, titanium nitride, titanium oxide, tantalum nitride, and tantalum oxide. In some embodiments, the material from which a microdisk is made may be transparent to a characteristic wavelength of the emission radiation (e.g., transmit at least 80% of the intensity at the characteristic wavelength). In some cases, the material from which a microdisk is made may be semi-transparent to a characteristic wavelength of the emission radiation (e.g., transmit between 50% and 80% of the intensity at the characteristic wavelength). By having a higher refractive index than the surrounding medium, the microdisk 1-415 can effectively collect and concentrate emission radiation from the reaction chamber 1-130 and re-radiate the emission in a concentrated manner onto a corresponding sensor 1-122 as compared to a same structure that does not have a microdisk.

According to some embodiments, a microdisk comprises a resonant cavity. In some cases, the resonant cavity may be a weak resonant cavity (e.g., an optical cavity having a quality (Q) factor between 10 and 100 or between 10 and 1000). The resonant cavity is capable of collecting emission radiated from the reaction chamber 1-130 and re-radiating the emission with improved directionality toward the sensor 1-122. "Improved directionality" in this context means that the re-radiated emission is condensed and directed toward the sensor 1-122 compared to a case when the microdisck 1-605 is not present. For example, a transverse intensity beam profile (FWHM value) of a beam of re-radiated emission travelling from the microdisk 1-605 to the sensor 1-122 is less than a transverse intensity beam profile (FWHM value) of a beam of radiated emission travelling from the reaction chamber to the sensor 1-122 when the microdisk is not present, where both beam profiles are measured at a same location (e.g., at an entrance surface to the sensor 1-122). By reducing the transverse intensity beam profile, more radiation can be condensed onto the sensor 1-122. In some cases, the reduction in transverse intensity beam profile (FWHM) is between 10% and 50%.

In some embodiments, the microdisk 1-605 may be shaped as a circular disk having a thickness t and diameter D, thereby providing rotational symmetry. In some embodiments, the microdisk 1-605 may be shaped as an ellipse, a hexagon, an octagon, a square, a triangle, or any other suitable shape. In some cases, a microdisk 1-605 may be positioned such that the center of the disk is essentially aligned along a z-axis that runs through a center of the reaction chamber 1-130. In some embodiments, reaction chamber 1-130, microdisk 1-605, and sensor 1-122 may be aligned to one another along the z-axis.

The phrase "characteristic wavelength" or "wavelength" is used to refer to a central or predominant wavelength within a limited bandwidth of radiation (e.g., a central or peak wavelength within an excitation bandwidth for excitation radiation or within an emission bandwidth for emission radiation). In some cases, "characteristic wavelength" or "wavelength" may be used to refer to a peak wavelength within a total bandwidth of radiation output by a source.

In some implementations, a microdisk 1-605 may be disposed between 500 nm and 1500 nm below the waveguide 1-115 or an optical source. In some cases, a microdisk 1-605 may be disposed between 800 nm and 1300 nm below the waveguide 1-115 or an optical source. In some implementations, a microdisk 1-605 may be disposed between 900 and 1250 nm below the waveguide 1-115 or an optical source. Improved performance may be obtained when a microdisk 1-605 is disposed between 1000 and 1500 nm below the waveguide 1-115 or an optical source. Further, in some embodiments, a microdisk 1-605 may have a thickness t along the z-axis of between 100 nm and 800 nm and a diameter D between 0.5 microns (µm) and 2 µm.

According to some embodiments, a microdisk 1-605 may be surrounded by one or more radially symmetric rings 1-705, as depicted in FIG. 1-7. Rings 1-705 may be formed of the same material or a different material as microdisk 1-605, such as silicon nitride or any other material described above that is used to form the microdisk. In some implementations, the one or more rings 1-705 may be formed during a same process that is used to form the microdisk 1-605 and may be concentric with a central vertical axis of the microdisk 1-605. According to some embodiments, there may be only one ring surrounding a microdisk 1-605. The one or more rings 1-705 may be formed at a same level as the microdisk or may be offset in the z-direction. The one or more rings 1-705 may further increase an amount of emission radiation received at the sensor 1-122, compared to a microdisk 1-605 only. For example, the one or more rings 1-705 and microdisk 1-605 may be patterned and arranged as a Fresnel zone plate (or approximation thereof) for a characteristic emission wavelength having a value between 560 nm and 700 nm. When present, the one or more rings may provide further concentration, focusing, and/or improved directionality of the emission re-radiated onto the sensor 1-122 compared to a microdisk alone. In some cases when one or more rings 1-705 are used, the reduction in transverse intensity beam profile (FWHM) may be between 20% and 70%.

According to some embodiments, the rings 1-705 and intervening medium 1-610 provide regions of alternating optical material. For example, the rings 1-705 and intervening medium 1-610 may alternate between regions of a first refractive index and a second refractive index and/or regions of a first optical transmissivity and regions of a second optical transmissivity for the emission radiation. The alternating regions may cause diffraction such that radiation transmitted through the more transparent regions to constructively interfere at a desired focal point, e.g., a center of the sensor 1-122, for the characteristic emission wavelength. In some cases, enhancement of emission radiation received at the sensor 1-122 may occur even if rings 1-705 are not configured as a Fresnel zone plate or even if only one ring 1-705 is present in the integrated device.

A thickness of the one or more rings 1-705 may be essentially the same as or different from a thickness of the microdisk. In some implementations, a thickness of the one or more rings 1-705 along the z-axis can be any value between 100 nm and 800 nm. A diameter of a ring can be any value between 0.6 µm and 4 µm. A size of a gap between rings 1-705 along the x-axis may vary within a device and can be any value between 100 nm and 500 nm.

Another example of optical structures that may be included at a pixel of an integrated device is shown in FIG. 2-1. According to some implementations, one or more iris layers 2-125 may be formed above the sensor 1-122. An iris layer 2-125 may include an opening or hole 2-112 through a light-reducing material. The light-reducing material may comprise a metal, polymer, semiconductor, or any material that rejects (e.g., absorbs and/or reflects) a majority of excitation radiation incident on the iris layer 2-125. The light-reducing material may also reject emission radiation in some cases. The hole 2-112 can allow emission from the reaction chamber 1-130 to pass through the iris layer 2-125 and reach the sensor 1-122, while the light-reducing material blocks or attenuates radiation from other directions (e.g., from adjacent pixels or from scattered excitation radiation). For example, an iris layer 2-125 can block or attenuate scattered excitation radiation at wide angles of incidence from striking the sensor 1-122 and contributing to background noise. In some embodiments, an iris layer 2-125 may be formed from a conductive material and provide a potential reference plane or grounding plane for circuitry formed on or above the substrate 1-105. In some embodiments, an iris layer 2-125 may be formed from a dielectric material. The hole 2-112 in the iris layer may be shaped in any suitable way, such as a square, rectangle, disk, ellipse, polygon, etc.

In the example of FIG. 2-1, two iris layers 2-125 are included. One iris layer is disposed between the microdisk 1-605 and a discriminating optical structure 2-120 that may be configured to pass emission radiation and attenuate excitation radiation that is incident on the sensor 1-122. One iris layer is disposed between the discriminating optical structure 2-120 and a complementary metal-oxide-semiconductor (CMOS) circuitry 2-110 and/or interconnects. Examples of a discriminating optical structure 2-120 include, but are not limited to, a diffraction grating filter, a multi-layer dielectric optical filter, a single or multi-layer semiconductor absorber exhibiting a band edge (as described in U.S. Provisional Application Ser. No. 62/831,237 filed on Apr. 9, 2019, titled "Semiconductor Optical Absorption Filter for an Integrated Device" which is incorporated by reference herein in its entirety), and a microfabricated structure having periodic or quasi-periodic modulations in refractive index in two or three-dimensions such as a photonic band-gap structure (as described in U.S. Provisional Application Ser. No. 62/863,635 filed on Jun. 19, 2019, titled "Optical Nanostructure Rejecter for an Integrated Device and Related Methods," which is incorporated by reference herein in its entirety. Although two iris layers 2-125 are shown in FIG. 2-1, there may be fewer or more iris layers at a pixel of an integrated device. In some cases, a single iris layer may be used and may be located between the reaction chamber 1-130 and microdisk 1-605 or between the microdisk 1-605 and sensor 1-122. In some embodiments, there may be three or more iris layers located between a waveguide 1-115 and sensor 1-122. The opening diameters of the irises, when multiple irises are used, may be the same or different. In some embodiments, one or more interconnect layers with CMOS circuitry 2-110 may be patterned to form an iris for a sensor 1-122.

In some implementations, there can be one or more additional transparent or semitransparent layers 2-130 formed on the substrate 1-105 and located between the substrate and the optical waveguide 1-115. These additional layers may be formed from an oxide or a nitride, and may be of the same type of material as the transparent or semitransparent material that the reaction chamber 1-130 is formed in or as the surrounding medium 1-610 that the microdisk 1-605 is formed in, according to some embodiments.

According to some embodiments, a microdisk 1-605 comprises a micro-resonator that can couple in emission radiation from the reaction chamber 1-130 and re-emit the radiation towards the sensor 1-122. In some implementations, the microdisk 1-605 may efficiently couple emission radiation traveling at an angle to the vertical z axis into resonant optical modes of the microdisk and re-radiate the coupled emission towards the sensor 1-122, thereby improving collection of these off-axis emissions from the reaction chamber 1-130. To enhance resonator characteristics, a thickness t of the microdisk 1-605, divided by a refractive index of the microdisk, may be an integral number of half wavelengths. According to some example embodiments, a thickness t of a silicon nitride microdisk may be approximately 200 nm, approximately 350 nm, or approximately 480 nm for emission radiation having a characteristic wavelength of about 570 nm. The inventors have found that microdisks having a thickness of 400 nm or more provide better collection of emission radiation than microdisks having a thickness less than 300 nm.

FIGS. 2-2 and 2-3 depict example optical intensity calculated for a pixel of an integrated device having a structure similar to that depicted in FIG. 2-1. For this simulation, the waveguide 1-115 and microdisk 1-605 comprise silicon nitride surrounded by silicon oxide. Two irises 2-125 are located between the microdisk 1-605 and CMOS layers (one shown) 2-110. The microdisk 1-605 is formed as a circular disk. For this simulation, the microdisk 1-605 has a thickness of 450 nm and radius of 1.2 µm, and the top of the microdisk is located approximately 1.4 µm below waveguide 1-115. The two irises each have a diameter of 1.6 µm and are separated vertically by approximately 1 µm. In some cases, the irises may be separated vertically by a distance between 0.5 µm and 3 µm. A sensor may be located just below the CMOS circuitry 2-110, though is not shown in the plots. For this example simulation, the excitation radiation has a characteristic wavelength ($\lambda=\lambda_{excitation}$) of 532 nm and the emission radiation has a characteristic wavelength ($\lambda=\lambda_{emission}$) of 572 nm. The optical intensity patterns in FIG. 2-2 and FIG. 2-3 were computed with software that solves Maxwell's equations (e.g., using a finite-difference time-domain analysis) within a simulation domain. In this example, the following initial conditions were used for the excitation and emission radiation: 1) radiation at $\lambda=\lambda_{excitation}$ is coupled into the single-mode waveguide 1-115 from an external source and illuminates the waveguide 1-115 uniformly along the length of the waveguide, and 2) radiation at $\lambda=\lambda_{emission}$ is generated in the reaction chamber 1-130 in response to the excitation radiation. It will be appreciated that the parameters given above in connection with FIG. 2-2 and FIG. 2-3 are for illustrative purposes only, and that other wavelengths and other optical nanostructure parameters (periodicity, width, thickness, etc.) may be used.

As illustrated in FIG. 2-2, for $\lambda=\lambda_{emission}$, a significant portion of the emission radiation is collected by microdisk 1-605 and guided through irises 2-125 toward the sensor 1-122. Such an increase in radiation collection may increase the SNR, resulting in faster and/or more accurate measurements. In FIG. 2-2, the reaction chamber 1-130 and waveguide 1-115 are aligned so that their centers are directly over centers of the microdisk 1-605 and apertures 2-125. Accordingly, the emission radiation travelling from the microdisk 1-605 may fall centrally on a sensor 1-122 located below the irises 2-125.

The inventors have also recognized and appreciated that semiconductor fabrication requires aligning multiple layers during the fabrication process, and that misalignment of layers may occur. In FIG. 2-3, the reaction chamber 1-130 and waveguide 1-115 are aligned so that their centers are shifted laterally by about 250 nm from the centers of the microdisk 1-605 and irises 2-125. Even for such a misalignment, the microdisk 1-605 can still collect and guide a significant portion of the emission radiation towards the sensor 1-122. The sensor 1-122 may have a detection area that is larger than the lower iris 2-125, and the emission radiation may fall off-center on the sensor 1-122. Collection of emission radiation by the microdisk 1-605 may therefore tolerate misalignment (e.g., up to at 250 nm or more) of components in fabrication of such integrated devices.

For a pixel of an integrated device such as the example depicted in FIG. 1-4, FIG. 1-5, or FIG. 2-1, the amount of emission radiation collected by the sensor will typically depend upon one or more physical parameters of the structure (e.g., microdisk thickness, microdisk diameter, microdisk material, surrounding medium material, iris location, iris diameter, distance of microdisk from the reaction chamber, etc.). One or more of these parameters can be selected and/or adjusted for microfabrication to improve performance of the optical detection within a pixel and increase an amount of emission radiation received by a sensor 1-122. For example, increasing a thickness of the microdisk 1-605 and/or changing its spacing from the reaction chamber 1-130 may increase an amount of emission radiation received by a sensor 1-122 within the pixel. Additionally or alternatively, changing iris diameters and/or locations of irises may increase an amount of emission radiation received by a sensor 1-122 within the pixel.

FIG. 3-1 is a plot of simulation results illustrating normalized collection efficiency (vertical axis) plotted as a function of vertical distance (horizontal axis) between the microdisk 1-605 and a metal layer coating 1-150 surrounding a reaction chamber 1-130. The simulation results are for a pixel structure such as that of FIG. 2-1 (though without a discriminating optical structure 2-120). The collection efficiency is an amount of intensity received at a sensor 1-122 normalized to the highest amount of intensity received by the sensor 1-122 over the range of distances used in the simulation. The emission radiation has a characteristic wavelength of 572 nm in this example.

In FIG. 3-1, the normalized collection efficiency is plotted for a distance between the microdisk 1-605 and the coating 1-150 which varies between 1200 nm and 1775 nm. The distance is measured from a top of the metal coating 1-150 to a top of the microdisk 1-605. The normalized collection efficiency exhibits a periodic behavior with a period of approximately 200 nm. The normalized collection efficiency further exhibits an average slope which decreases as the distance between the microdisk 1-605 and the metal coating 1-150 increases. The periodic behavior is associated with the resonant characteristics of a microdisk 1-605, as described above. The periodic behavior can have a further dependence on the refractive index of the microdisk 1-605 and a refractive index of material(s) surrounding the microdisk and/or waveguide. The surrounding material (oxide in this example) may be referred to as cladding material. The periodic behavior indicates that there are preferred locations (e.g., at or near the maxima of the curve) for which the microdisk 1-605 within a pixel of an integrated device will provide improved collection efficiency. In some embodiments, the preferred locations may correspond to a distance between a top of the microdisk 1-605 and the metal coating 1-150 being approximately equal to an integer number of half wavelengths of the emission radiation in the cladding material.

Figures 1, 2, 3, 4:
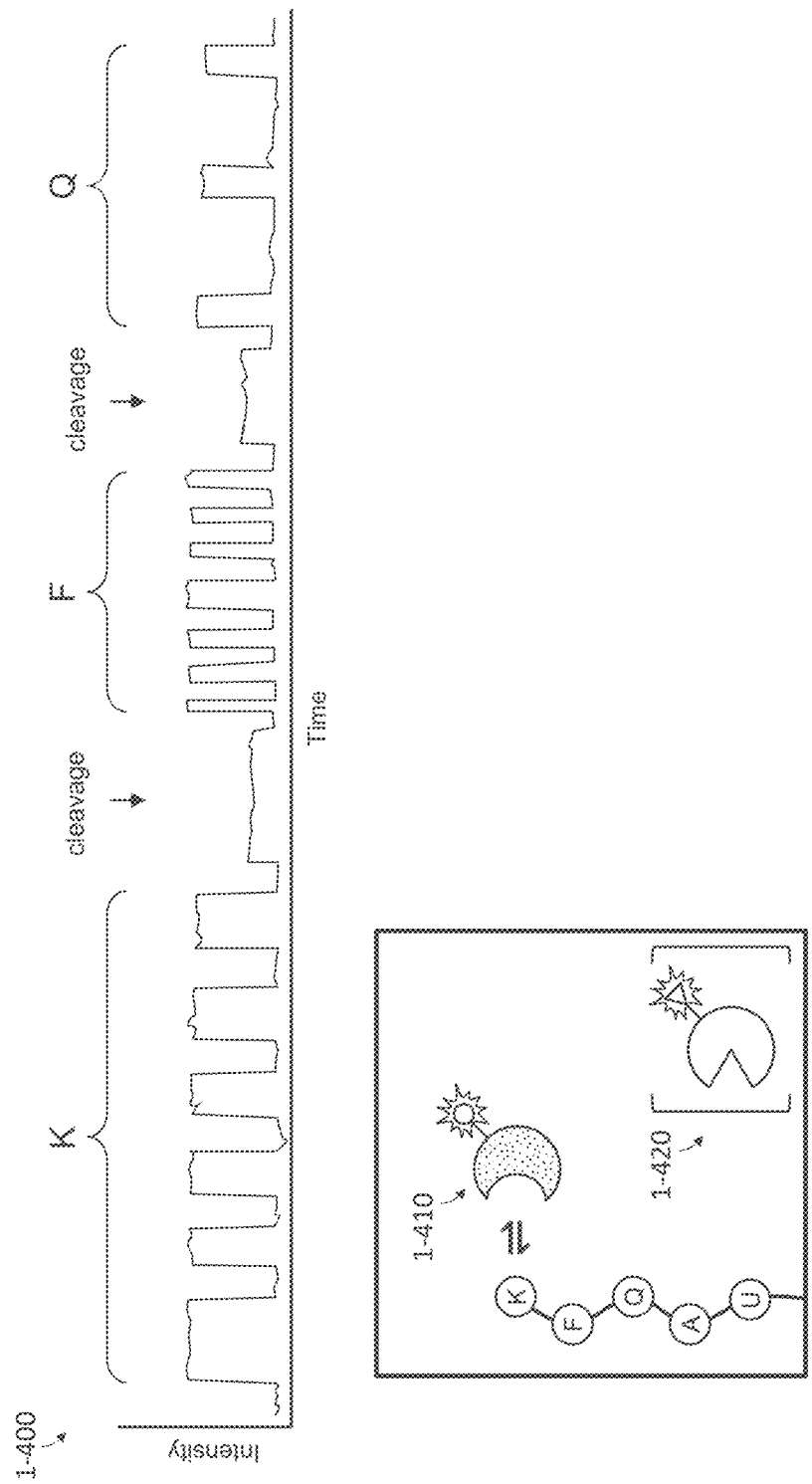

Improved collection efficiency and an increase in an amount of signal received by a sensor is indicated in the plots of FIG. 3-2, FIG. 3-3, and FIG. 3-4 for example simulations. The results plotted in FIG. 3-2 are for a same overall structure like that shown in FIG. 2-1 (without the discriminating optical structure 2-120), but for two different cases. The lower curve 3-220 is for a pixel structure that does not include a microdisk. The upper curve 3-210 is for pixel structure that includes a microdisk 1-605. FIG. 3-2 plots simulated collection efficiency (vertical axis) as a function of iris diameter (horizontal axis) for each case. The upper curve 3-210 (structure with microdisk) shows a higher collection efficiency than the lower curve 3-220 (structure without microdisk) for all iris diameters. For these simulations, collection efficiencies plotted are a ratio of intensity passed through the last iris before the sensor 1-122 to the total intensity of emission radiation from the reaction chamber 1-130. For the example pixel structures of the simulations, two irises were located between the waveguide 1-115 and sensor 1-122. The upper iris was located 2 microns from the waveguide and 1.7 microns from the reaction chamber 1-130. The irises were spaced 2.5 microns apart. The surrounding medium 1-610 around the waveguide and irises was silicon oxide. For the case with the microdisk, the microdisk had a diameter of 1400 nm and a thickness of 480 nm. A top of the microdisk was spaced 1 micron from the bottom of the reaction chamber 1-130.

Although collection efficiency increases with iris diameter, larger iris diameters may pass more unwanted radiation (e.g., scattered excitation radiation) to the sensor 1-122. Therefore, it can be beneficial to use smaller iris diameters (e.g., diameters less than 2.5 microns). For some iris diameters, the collection efficiency with a microdisk can be between 2 and 5 times the collection efficiency without a microdisk (e.g., with iris diameters in a range between 1 micron and 3 microns).

The results shown in FIG. 3-3 indicate that there can be a preferred pairing of microdisk diameter and iris diameters. The conditions used to generate the data for FIG. 3-3 were the same as those used to generate the data for FIG. 3-2, however microdisk and iris diameters were varied. The plot shows contours of collection efficiency normalized to the highest value of collection efficiency obtained over the range of values used to generate the plot. The plot may be used to select a diameter for a microdisk 1-605 if iris diameters have been determined or are constrained. For example, if iris diameters are selected to be approximately 1.2 microns for purposes of blocking a desired amount of excitation radiation, then a microdisk having a diameter of approximately 1 micron would provide a higher collection efficiency than a microdisk having a diameter of approximately 1.2 micron.

The results plotted in FIG. 3-4 show how changes in upper and lower iris diameters can affect an increase in an amount of emission radiation received by a sensor 1-122. The conditions used to generate the data for FIG. 3-4 were the same as those used to generate the data for FIG. 3-2, however the iris diameters were varied independently. The plot shows contours of an enhancement factor (a ratio of an amount of emission radiation received by the sensor with the microdisk to an amount of emission radiation received by the sensor without the microdisk present).

Two example microfabricated structures that include microdisks and that may be used in an integrated device are shown in the scanning electron microscopy (SEM) images of FIG. 4-1 and FIG. 4-2. Several physical parameters are different in the two example structures. Parameters that can be adjusted controllably during microfabrication include the distances d1 between the bottom surface of the waveguides 4-115 and 4-215 (or reaction chambers 4-130, 4-230) and the top surface of the microdisks 4-105 and 4-205, respectively. The diameters and thicknesses of the microdisks 4-105 and 4-205 can also be adjusted controllably, as depicted. Additionally, the diameters of the openings of irises 4-125 and 4-225 and their locations can be adjusted controllably as depicted. In FIG. 4-1, the microdisk 4-105 has a larger diameter than the opening of iris 4-125, while in FIG. 4-2 the microdisk 4-205 has a smaller diameter than the opening of iris 4-225. In these examples, multi-layer optical filters 4-120, 4-220 are located below the irises 4-125, 4-225. Other parameters that may affect the collection efficiency include the vertical distance between the microdisks 4-105, 4-205 and the iris layers 4-125, 4-225, which can be controllably adjusted during microfabrication.

II. Methods for Fabricating Optical Microdisks

Figures 1, 2, 3, 4, 5:
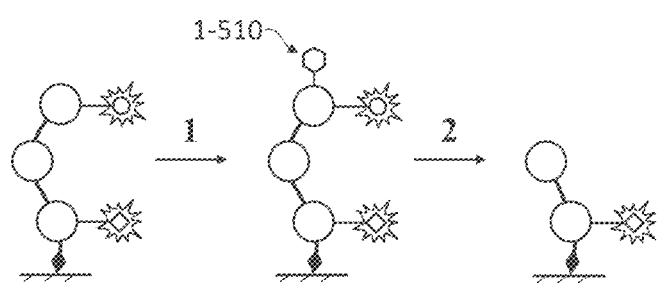
Figures 1, 2, 3, 4, 5, 6:
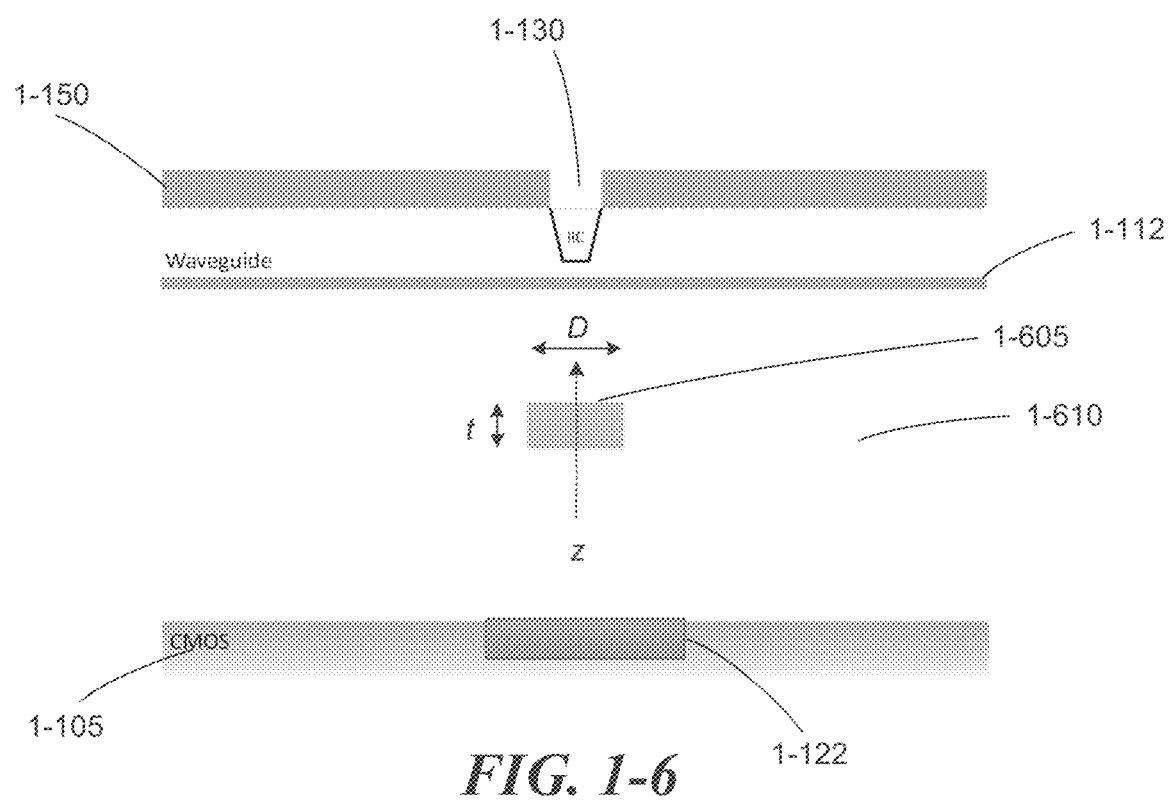
Figures 1, 2, 3, 4, 5, 6, 7:
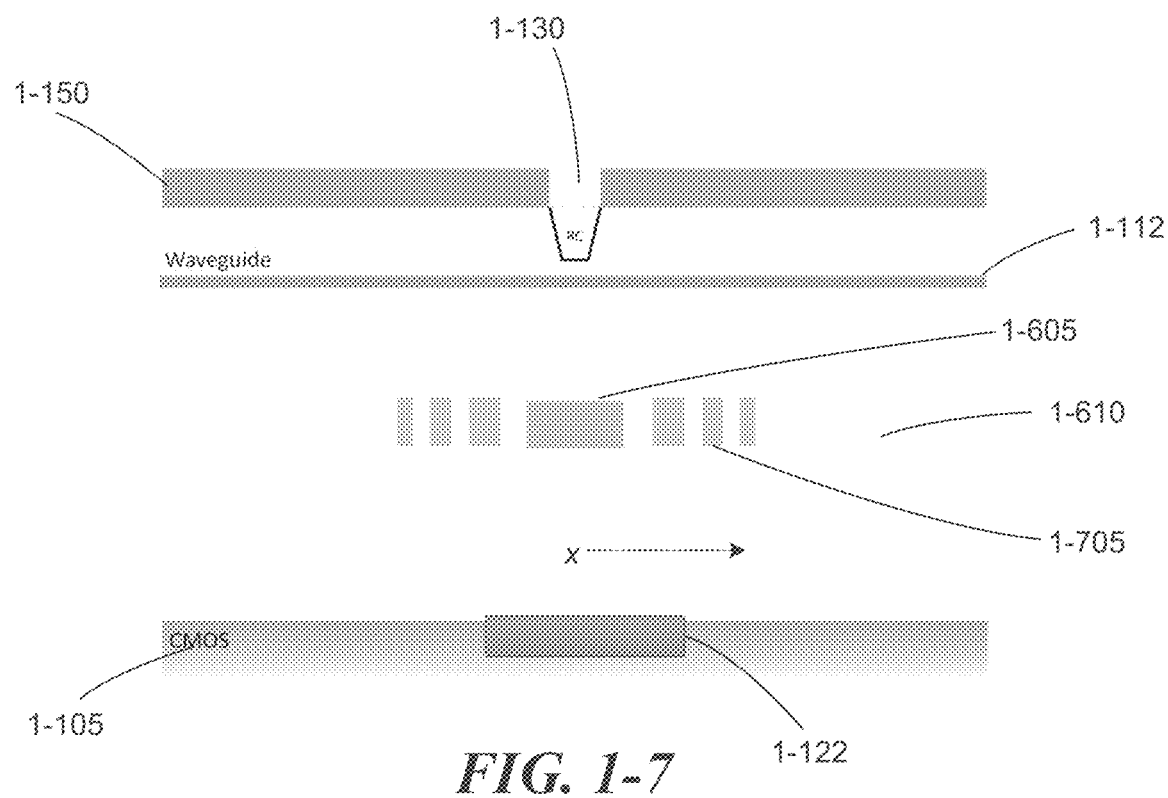
Figures 1, 2:
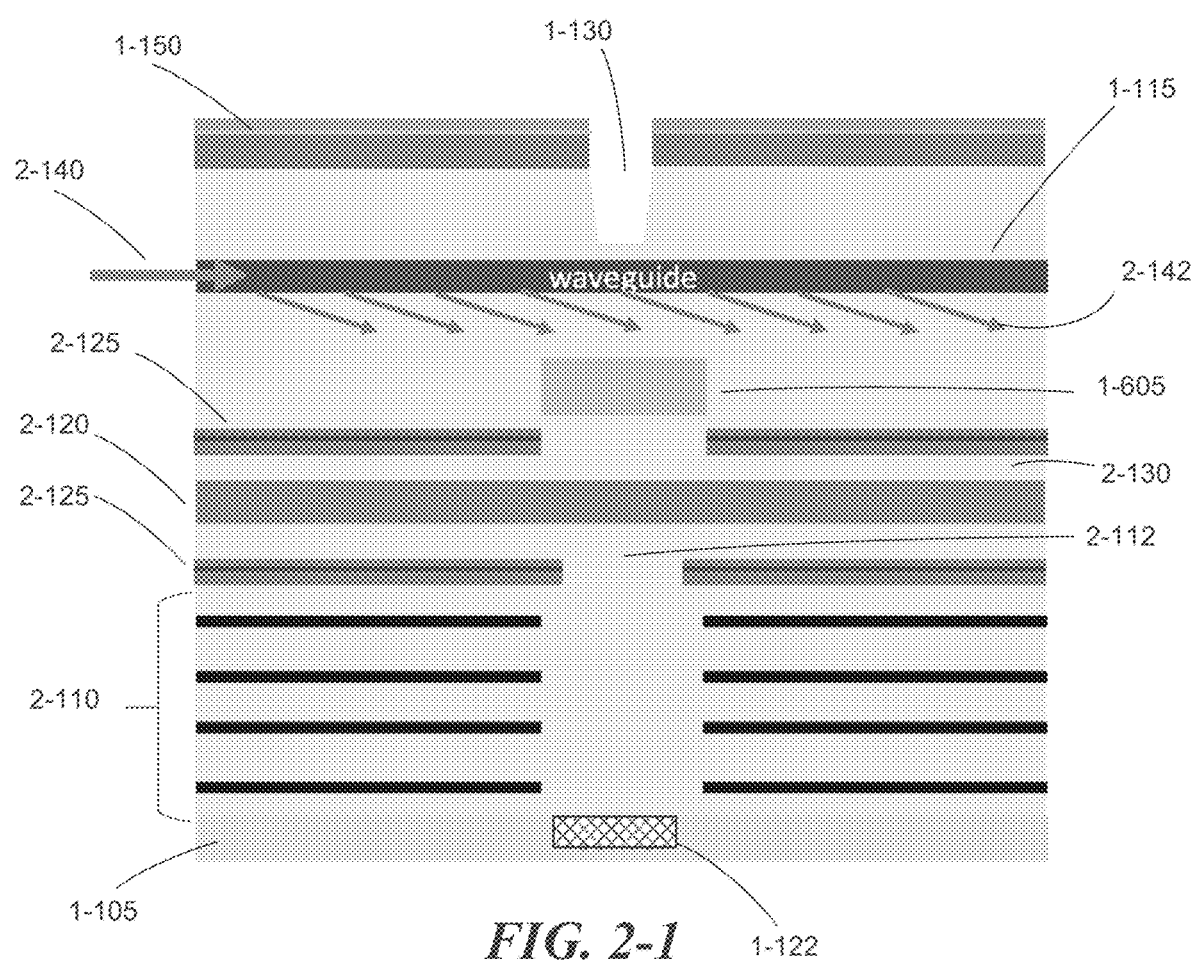
Figure 2:
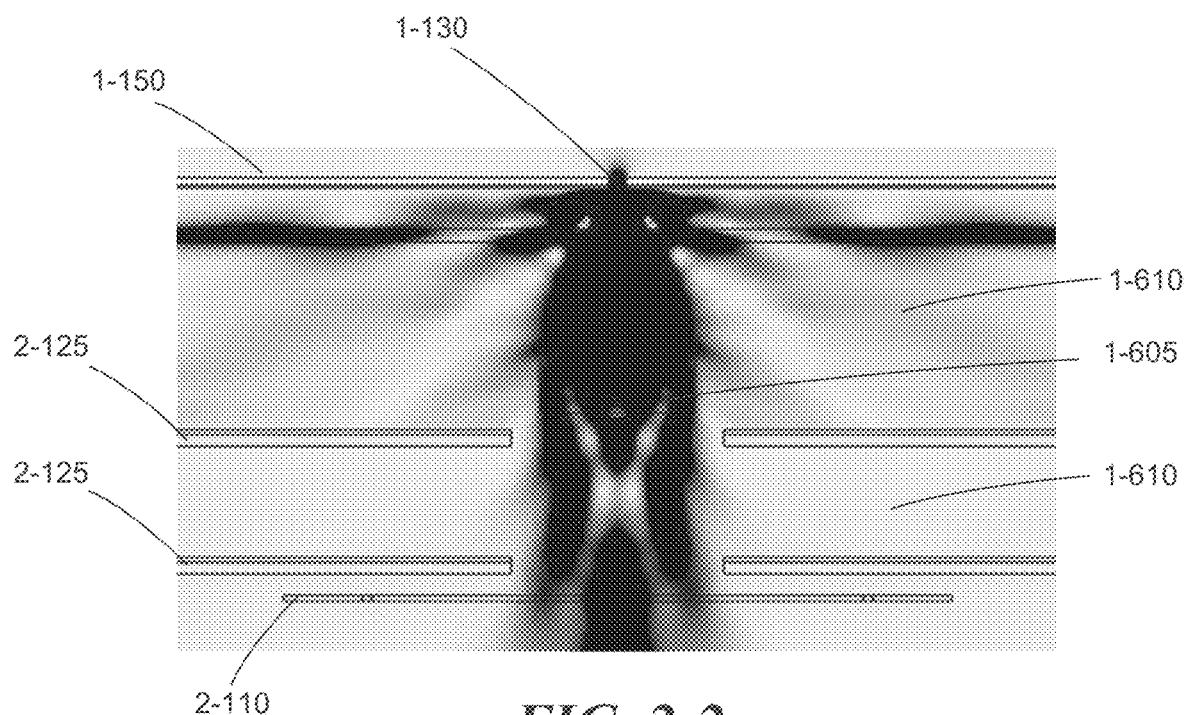
Figures 2, 3:
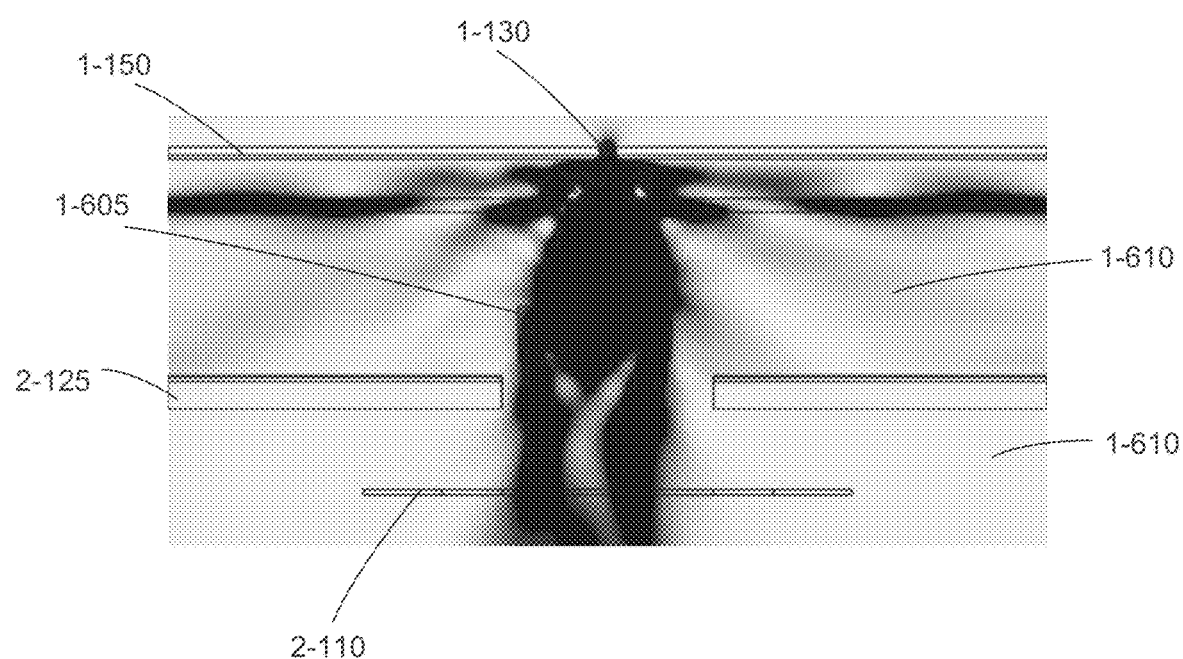
Figures 1, 3:
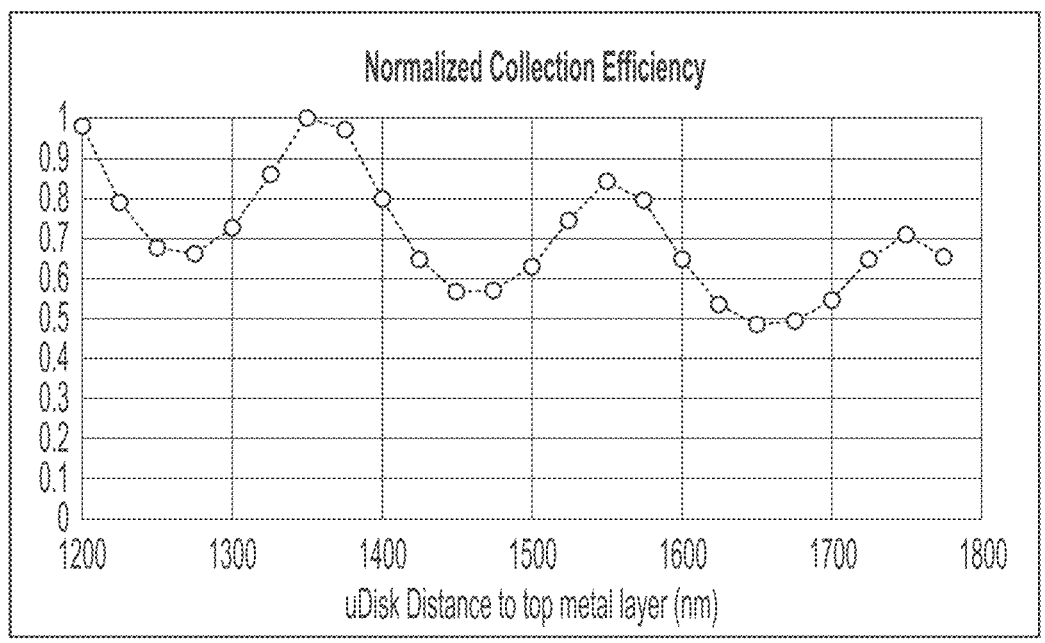
Figures 2, 3:
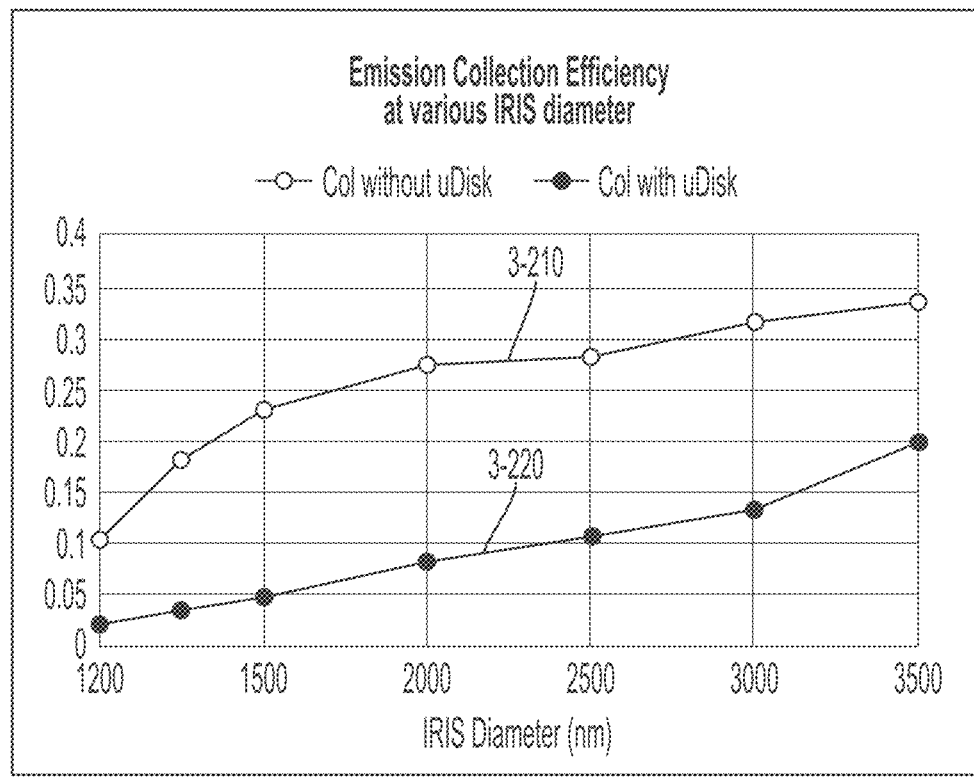
Figure 3:
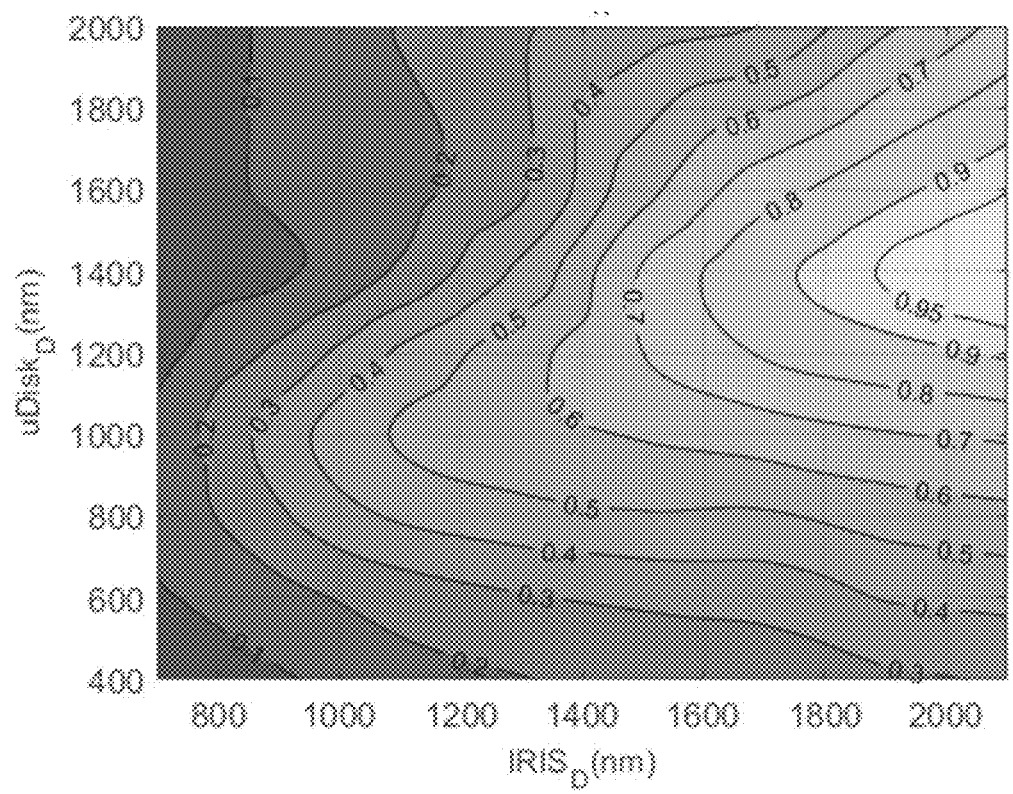
Figures 3, 4:
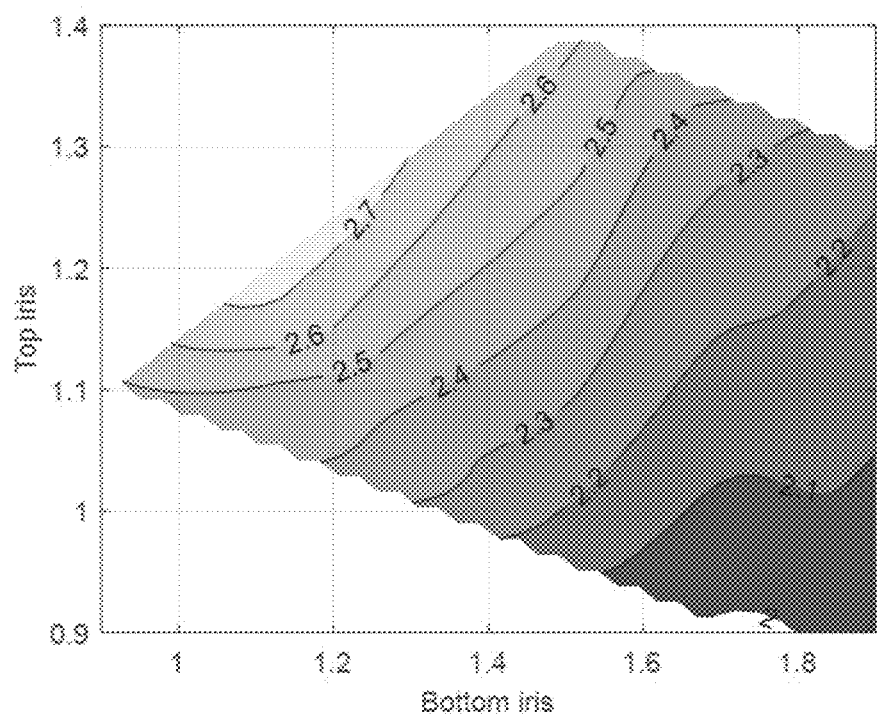
Figures 1, 4:
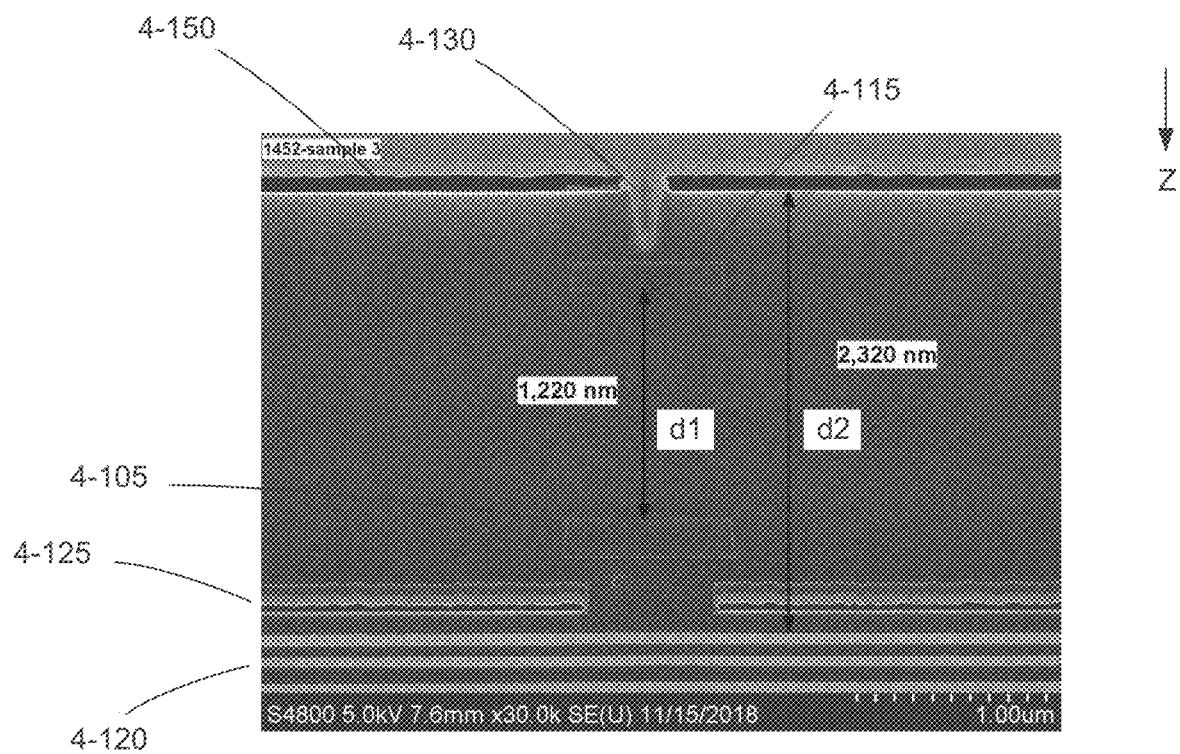
Figures 2, 4:
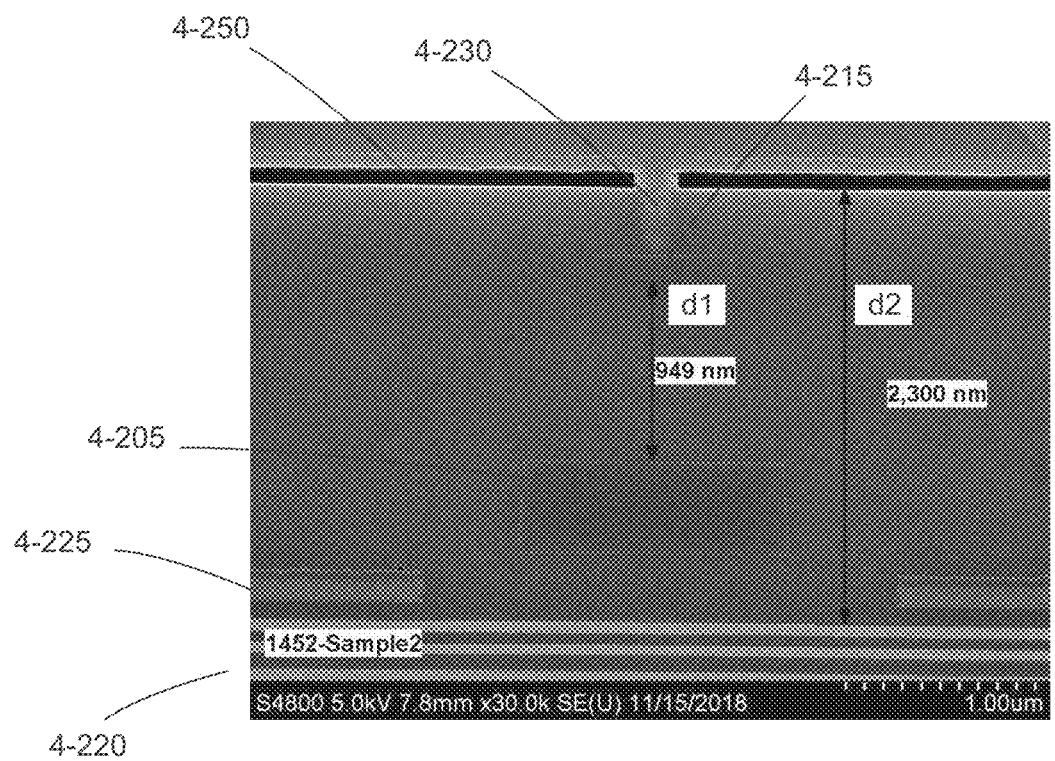
Figures 1A, 5:
Figures 1B, 5:
Figures 1C, 5:
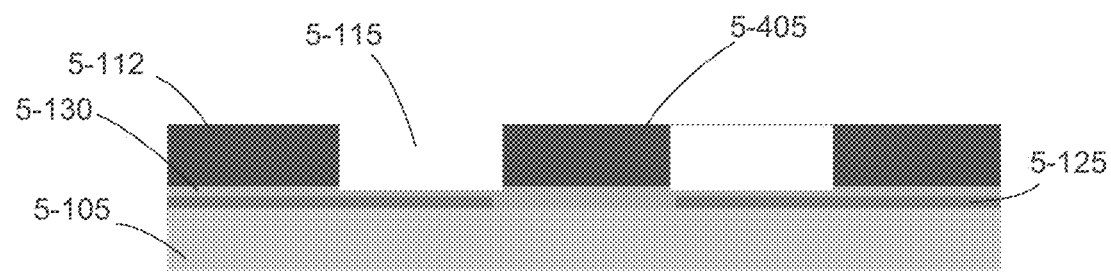
Figures 1D, 5:
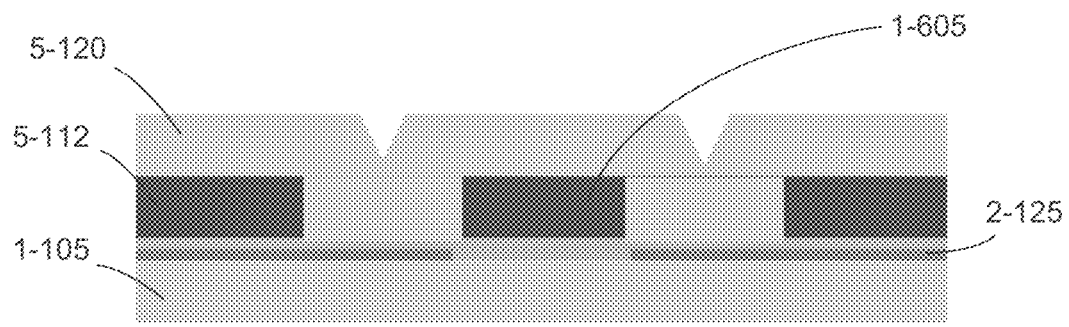
Figures 1E, 5:
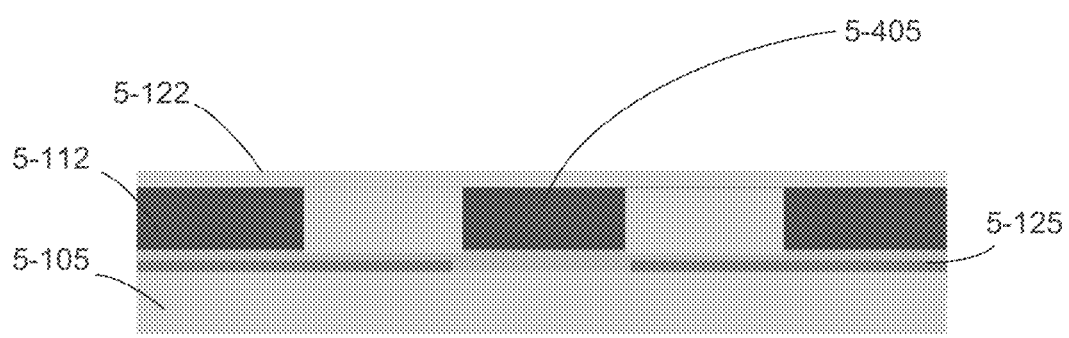
Figures 1F, 5:
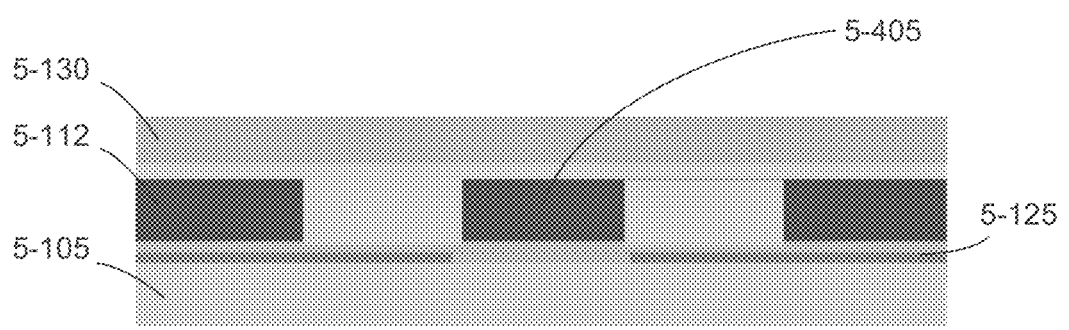

FIGS. 5-1A through 5-1F illustrate example structures associated with microfabrication steps that may be used to form an optical microdisk at a pixel of an integrated device. Although structure for only one pixel is shown, it will be appreciated that multiple pixels can be fabricated simultaneously using planar microfabrication processes in accordance with the illustrated embodiments. In FIG. 5-1A, a substrate 5-105 may be provided or obtained upon which lithography steps may be performed. Substrate 5-105 may include some structure already formed on the substrate 5-105. For example, substrate 5-105 may include part of the structure shown in FIG. 1-1 or FIG. 2-1 below the microdisk 5-405, such as iris 5-125 and/or CMOS circuitry. In some embodiments, substrate 5-105 may comprise a bulk semiconductor substrate, though other types of bulk substrates may be used in some implementations. In the example of FIG. 5-1A, substrate 5-105 includes an iris layer 5-125 and a planarized layer of silicon dioxide 5-130 above the iris layer 5-125.

According to some embodiments, a first material layer 5-110 may be deposited or grown on substrate 5-105, as depicted in FIG. 5-1B. The first material layer 5-110 may comprise a high index dielectric material such as silicon nitride, and may be deposited to a thickness equal to the desired thickness of resulting microdisk 5-405. The first material layer 5-110 may be deposited, for example, by physical vapor deposition (PVD) techniques such as sputtering or chemical vapor deposition (CVD) techniques such as plasma-enhanced chemical vapor deposition (PECVD) or high-density plasma (HDP) PECVD.

Subsequently, a photoresist layer may be deposited over first material layer 5-110 and then patterned (not shown). The patterned photoresist layer may be used as an etch mask to etch the first material layer 5-110 into a desired pattern, depicted in FIG. 5-1C. Etching may be done by, for example, a wet etching process or a plasma etching process such as a reactive ion etch (RIE) or a deep reactive ion etch (DRIE). The remaining photoresist may be removed in a cleaning step, leaving a patterned structure such as the structure depicted in FIG. 5-1C. The resulting structure of the etched first material layer 5-110 may include a microdisk 5-405 and a plurality of residual structures 5-112 separated from the microdisk and formed from a same material as the microdisk 5-405. In some cases, the residual structures 5-112 may be removed by masking the microdisk 5-405 and etching away the residual structures. In some embodiments, the residual structures may be retained, and may improve fidelity of the microdisk by providing, for example, an etch-stop material for a subsequent planarization step.

According to some implementations, an overcoat layer 5-120 can then be deposited to fill voids 5-115 and cover the microdisk structure 5-405 and the residual structures 5-112. The overcoat layer 5-120 may be deposited by any suitable method such as PVD, PECVD, HDP PECVD, or sputtering. The overcoat layer 5-120 may be formed of any suitable material such as silicon dioxide, as a non-limiting example. In some cases, due to the structure of voids 5-115, overcoat layer 5-120 may not be able to form a smooth top surface. Overcoat layer 5-120 may then be planarized by, for example, chemical-mechanical polishing (CMP) to form a planar surface 5-122 for subsequent processing, as depicted in FIG. 5-1E.

Optionally, one or more additional material layers 5-130 may be deposited onto the structure of FIG. 5-1E to form the structure of FIG. 5-1F. Additional layer(s) 5-130 may be deposited by any suitable method such as PVD, PECVD, HDP PECVD, or sputtering. The additional layers(s) 5-130 may be formed of any suitable material such as silicon dioxide, as a non-limiting example. Additional layers(s) 5-130 may be the same material as overcoat layer 5-120 or may be a different material. In some embodiments, additional layer(s) 5-130 may be planarized by CMP, additionally or alternatively to planarization of overcoat layer 5-120, to provide a smooth surface free of unwanted voids. Such a surface can be beneficial for low-loss waveguides such as those described herein. After the fabrication of the microdisk structure of FIG. 5-1F, additional components such as the waveguide and reaction chamber may be further fabricated on top of the structure to form a pixel of an integrated device, such as shown in the examples of FIG. 1-1 and FIG. 2-1.

In some embodiments and referring again to FIG. 5-1D, the overcoat layer 5-120 may not be planarized. The structure of the overcoat layer 5-120 over the microdisk 5-405 can exhibit some positive lensing near the edges of the microdisk 5-405, provided the immediately additional layer 5-130 has a lower refractive index. According to some embodiments, the immediately additional layer 5-130 may fill voids in the overcoat layer 5-120, have a lower index of refraction than the overcoat layer 5-120 at a characteristic wavelength of the emission radiation, and have a planarized top surface. Such structure may further increase collection efficiency of emission radiation.

III. Conclusion

Having thus described several aspects of several embodiments of an optical microdisk, it is to be appreciated that various alterations, modifications, and improvements will readily occur to those skilled in the art. Such alterations, modifications, and improvements are intended to be part of this disclosure, and are intended to be within the spirit and scope of the invention. While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated, those of ordinary skill in the art will readily envision a variety of other means and/or structures for performing the function and/or obtaining the results and/or one or more of the advantages described, and each of such variations and/or modifications is deemed to be within the scope of the inventive embodiments described. More generally, those skilled in the art will readily appreciate that all parameters, dimensions, materials, and configurations described are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure may be directed to each individual feature, system, system upgrade, and/or method described. In addition, any combination of two or more such features, systems, and/or methods, if such features, systems, system upgrade, and/or methods are not mutually inconsistent, is included within the inventive scope of the present disclosure.

Further, though some advantages of the present invention may be indicated, it should be appreciated that not every embodiment of the invention will include every described advantage. Some embodiments may not implement any features described as advantageous. Accordingly, the foregoing description and drawings are by way of example only.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

The section headings used are for organizational purposes only and are not to be construed as limiting the subject matter described in any way.

Also, the technology described may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used, should be understood to control over dictionary definitions, definitions in documents incorporated by reference, and/or ordinary meanings of the defined terms.

Numerical values and ranges may be described in the specification and claims as approximate or exact values or ranges. For example, in some cases the terms "about," "approximately," and "substantially" may be used in reference to a value. Such references are intended to encompass the referenced value as well as plus and minus reasonable variations of the value. For example, a phrase "between about 10 and about 20" is intended to mean "between exactly 10 and exactly 20" in some embodiments, as well as "between $10\pm\delta1$ and $20\pm\delta2$" in some embodiments. The amount of variation $\delta1$, $\delta2$ for a value may be less than 5% of the value in some embodiments, less than 10% of the value in some embodiments, and yet less than 20% of the value in some embodiments. In embodiments where a large range of values is given, e.g., a range including two or more orders of magnitude, the amount of variation $\delta1$, $\delta2$ for a value could be as high as 50%. For example, if an operable range extends from 2 to 200, "approximately 80" may encompass values between 40 and 120 and the range may be as large as between 1 and 300. When exact values are intended, the term "exactly" is used, e.g., "between exactly 2 and exactly 200."

The term "adjacent" may refer to two elements arranged within close proximity to one another (e.g., within a distance that is less than about one-fifth of a transverse or vertical dimension of a larger of the two elements). In some cases there may be intervening structures or layers between adjacent elements. In some cases adjacent elements may be immediately adjacent to one another with no intervening structures or elements.

The indefinite articles "a" and "an," as used in the specification and in the claims, unless clearly indicated to the contrary, should be understood to mean "at least one."

The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A fluorescence detection system, comprising:
   a microfabricated optical structure, comprising:
   a substrate having a plurality of pixels, wherein two or more pixels of the plurality of pixels each comprise:
      an optical sensor;
      a microdisk; and
      an iris layer disposed between the microdisk and the optical sensor,
   wherein:
      the fluorescence detection system comprises, for each of the two or more pixels, a reaction chamber configured to hold a specimen for analysis;
      the fluorescence detection system comprises, for each of the two or more pixels, a waveguide configured to deliver excitation radiation to the reaction chamber;
      the optical sensor is configured to detect emission radiation emitted from the reaction chamber;
      the microdisk is disposed between the waveguide and the optical sensor and configured to increase an amount of the emission radiation that is received by the optical sensor compared to an amount of the emission radiation that would be received by the optical sensor without the microdisk;
      the microdisk is formed of a material substantially transparent at a wavelength of the emission radiation; and
      the microdisk comprises a dielectric material having a first index of refraction that is different from a second index of refraction for material surrounding the microdisk.

2. The fluorescence detection system of claim 1, further comprising:
   an instrument comprising an excitation light source,
   wherein the fluorescence detection system comprises optical components comprising the waveguides, the optical components being configured to interface with the instrument to receive the excitation radiation from the excitation light source, and the waveguides being configured to deliver the excitation radiation, received from the instrument, to the reaction chambers.

3. The fluorescence detection system of claim 1, wherein the microdisk forms a resonant cavity for collecting and re-radiating the emission radiation.

4. The fluorescence detection system of claim 1, wherein the microdisk is formed from silicon nitride.

5. The fluorescence detection system of claim 4, wherein the material surrounding the microdisk comprises silicon dioxide.

6. The fluorescence detection system of claim 4, wherein the optical sensor comprises a time-binning photodetector.

7. The fluorescence detection system of claim 1, wherein the microfabricated optical structure further comprises complementary metal-oxide-semiconductor (CMOS) circuitry integrated on the substrate and connected to the optical sensor, the CMOS circuitry comprising interconnects disposed between the waveguides and the microdisks.

8. A fluorescence detection system, comprising:
a microfabricated optical structure, comprising:
a substrate having a plurality of pixels, wherein two or more pixels of the plurality of pixels each comprise:
an optical sensor; and
a microdisk,
wherein:
the fluorescence detection system comprises, for each of the two or more pixels, a reaction chamber configured to hold a specimen for analysis;
the fluorescence detection system comprises, for each of the two or more pixels, a waveguide configured to deliver excitation radiation to the reaction chamber;
the optical sensor is configured to detect emission radiation emitted from the reaction chamber;
the microdisk is disposed between the waveguide and the optical sensor and configured to increase an amount of the emission radiation that is received by the optical sensor compared to an amount of the emission radiation that would be received by the optical sensor without the microdisk; and
the microdisk comprises an oxide or nitride material.

9. The fluorescence detection system of claim 8, further comprising:
an instrument comprising an excitation light source,
wherein the fluorescence detection system comprises optical components comprising the waveguides, the optical components being configured to interface with the instrument to receive the excitation radiation from the excitation light source, and the waveguides being configured to deliver the excitation radiation, received from the instrument, to the reaction chambers.

10. The fluorescence detection system of claim 8, wherein the microdisk forms a resonant cavity for collecting and re-radiating the emission radiation.

11. The fluorescence detection system of claim 8, wherein the microdisk is formed from silicon nitride.

12. The fluorescence detection system of claim 8, wherein the optical sensor comprises a time-binning photodetector.

13. The fluorescence detection system of claim 8, wherein the microfabricated optical structure further comprises complementary metal-oxide-semiconductor (CMOS) circuitry integrated on the substrate and connected to the optical sensor, the CMOS circuitry comprising interconnects disposed between the waveguides and the microdisks.

14. A fluorescence detection system, comprising:
a microfabricated optical structure, comprising:
a substrate having a plurality of pixels, wherein two or more pixels of the plurality of pixels each comprise:
an optical sensor; and
a microdisk,
wherein:
the fluorescence detection system comprises, for each of the two or more pixels, a reaction chamber configured to hold a specimen for analysis;
the fluorescence detection system comprises, for each of the two or more pixels, a waveguide configured to deliver excitation radiation to the reaction chamber;
the optical sensor is configured to detect emission radiation emitted from the reaction chamber;
the microdisk is disposed between the waveguide and the optical sensor and configured to increase an amount of the emission radiation that is received by the optical sensor compared to an amount of the emission radiation that would be received by the optical sensor without the microdisk; and
the microdisk comprises a dielectric material having a first index of refraction that is greater than a second index of refraction for material surrounding the microdisk by at least approximately 18% at a wavelength of the emission radiation.

15. The fluorescence detection system of claim 14, further comprising:
an instrument comprising an excitation light source,
wherein the fluorescence detection system comprises optical components comprising the waveguides, the optical components being configured to interface with the instrument to receive the excitation radiation from the excitation light source, and the waveguides being configured to deliver the excitation radiation, received from the instrument, to the reaction chambers.

16. The fluorescence detection system of claim 14, wherein the microdisk forms a resonant cavity for collecting and re-radiating the emission radiation.

17. The fluorescence detection system of claim 14, wherein the microdisk is formed from silicon nitride.

18. The fluorescence detection system of claim 14, wherein the optical sensor comprises a time-binning photodetector.

19. The fluorescence detection system of claim 14, wherein the first index of refraction is greater than the second index of refraction by at least approximately 38% at the wavelength of the emission radiation.

20. The fluorescence detection system of claim 14, wherein the microfabricated optical structure further comprises complementary metal-oxide-semiconductor (CMOS) circuitry integrated on the substrate and connected to the optical sensor, the CMOS circuitry comprising interconnects disposed between the waveguides and the microdisks.

* * * * *